United States Patent
Yoshikawa et al.

(10) Patent No.: US 9,934,935 B2
(45) Date of Patent: Apr. 3, 2018

(54) MULTI CHARGED PARTICLE BEAM WRITING APPARATUS AND MULTI CHARGED PARTICLE BEAM WRITING METHOD

(71) Applicant: NuFlare Technology, Inc., Yokohama-shi (JP)

(72) Inventors: Ryoichi Yoshikawa, Kawasaki (JP); Hideo Inoue, Miura-gun (JP); Hayato Kimura, Suntou-Gun (JP); Yasuo Kato, Yokohama (JP); Jun Yashima, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/225,969

(22) Filed: Aug. 2, 2016

(65) Prior Publication Data
US 2017/0047194 A1 Feb. 16, 2017

(30) Foreign Application Priority Data
Aug. 11, 2015 (JP) .................. 2015-158747

(51) Int. Cl.
*H01J 37/20* (2006.01)
*H01J 37/24* (2006.01)
*H01J 37/317* (2006.01)

(52) U.S. Cl.
CPC ............ *H01J 37/20* (2013.01); *H01J 37/243* (2013.01); *H01J 37/3177* (2013.01); *H01J 2237/20285* (2013.01); *H01J 2237/20292* (2013.01)

(58) Field of Classification Search
CPC ...... H01J 37/20; H01J 37/243; H01J 37/3177; H01J 2237/20285; H01J 2237/20292
(Continued)

(56) References Cited

U.S. PATENT DOCUMENTS

| 5,973,332 A | 10/1999 | Muraki et al. |
| 6,166,387 A | 12/2000 | Muraki et al. |

(Continued)

FOREIGN PATENT DOCUMENTS

| JP | H06-036995 | 2/1994 |
| JP | 2009-532887 | 9/2009 |

(Continued)

OTHER PUBLICATIONS

Office Action dated Jul. 5, 2017 in Korean Patent Application No. 10-2016-0101565 (with English translation of the Office Action).
(Continued)

*Primary Examiner* — Nicole Ippolito
(74) *Attorney, Agent, or Firm* — Oblon, McClelland, Maier & Neustadt, L.L.P.

(57) ABSTRACT

A multi charged particle beam writing apparatus includes a maximum irradiation time acquisition processing circuitry to acquire, for each shot of multi-beams, a maximum irradiation time of irradiation time of each of the multi-beams, a unit region writing time calculation processing circuitry to calculate, using the maximum irradiation time for each shot, a unit region writing time by totalizing the maximum irradiation time of each shot of a plurality of times of shots of the multi-beams which irradiate a unit region concerned during stage moving, for each unit region of a plurality of unit regions obtained by dividing a writing region of a target object, a stage speed calculation processing circuitry to calculate speed of the stage for each unit region so that the stage speed becomes variable, by using the unit region writing time and a stage control processing circuitry to variably control the stage speed.

10 Claims, 23 Drawing Sheets

(58) Field of Classification Search
USPC .......... 250/306, 307, 309, 310, 311, 492.1,
250/492.2, 492.21, 492.22, 492.23, 492.3
See application file for complete search history.

(56) References Cited

U.S. PATENT DOCUMENTS

| | | | |
|---|---|---|---|
| 6,323,499 B1 | 11/2001 | Muraki et al. | |
| 8,030,626 B2* | 10/2011 | Takekoshi | B82Y 10/00 250/398 |
| 2009/0134343 A1* | 5/2009 | Inoue | B82Y 10/00 250/492.22 |
| 2009/0200495 A1 | 8/2009 | Platzgummer | |
| 2014/0124684 A1 | 5/2014 | Matsumoto et al. | |

FOREIGN PATENT DOCUMENTS

| | | |
|---|---|---|
| JP | 2014-112639 | 6/2014 |
| KR | 10-2014-0007757 A | 1/2014 |

OTHER PUBLICATIONS

Korean Office Action dated Jan. 12, 2018, issued in Korean Patent Application No. 10-2016-0101565 (with English translation).

* cited by examiner

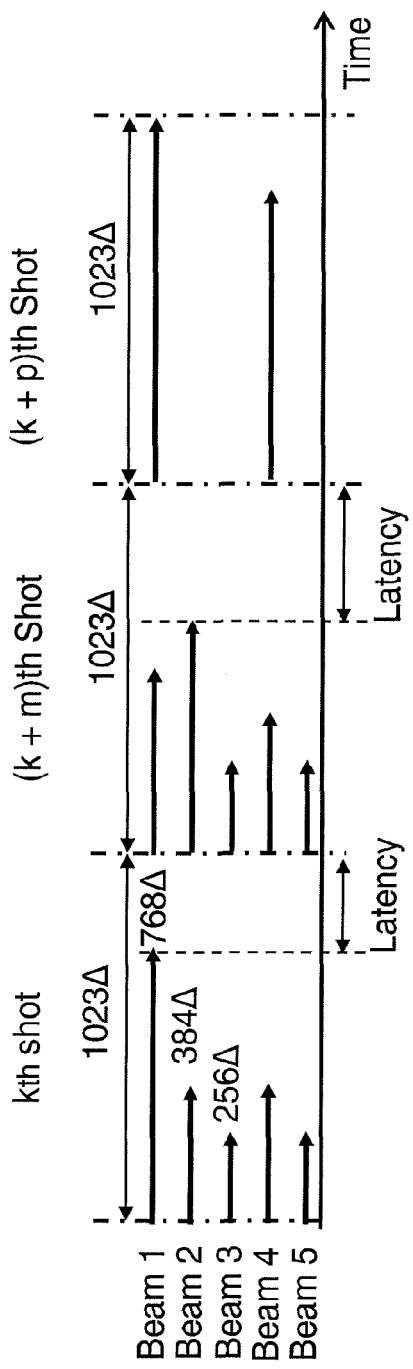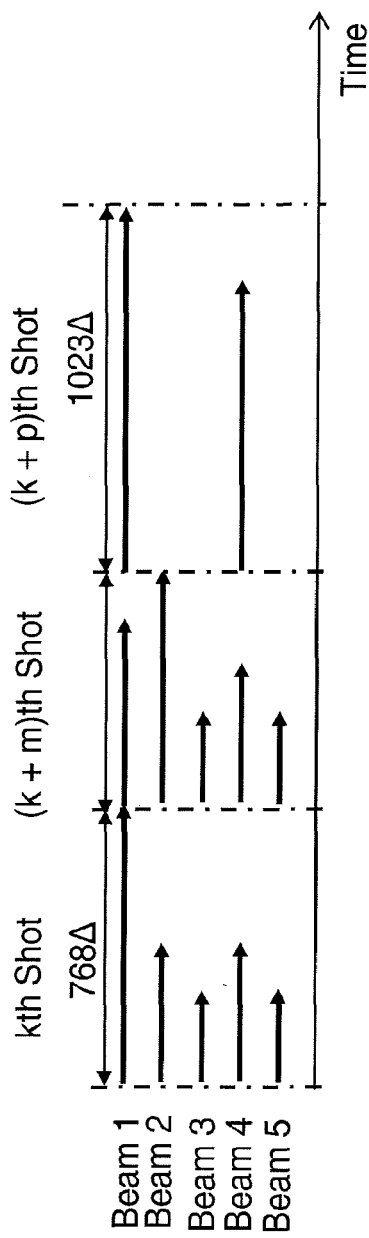
FIG. 8A
FIG. 8B

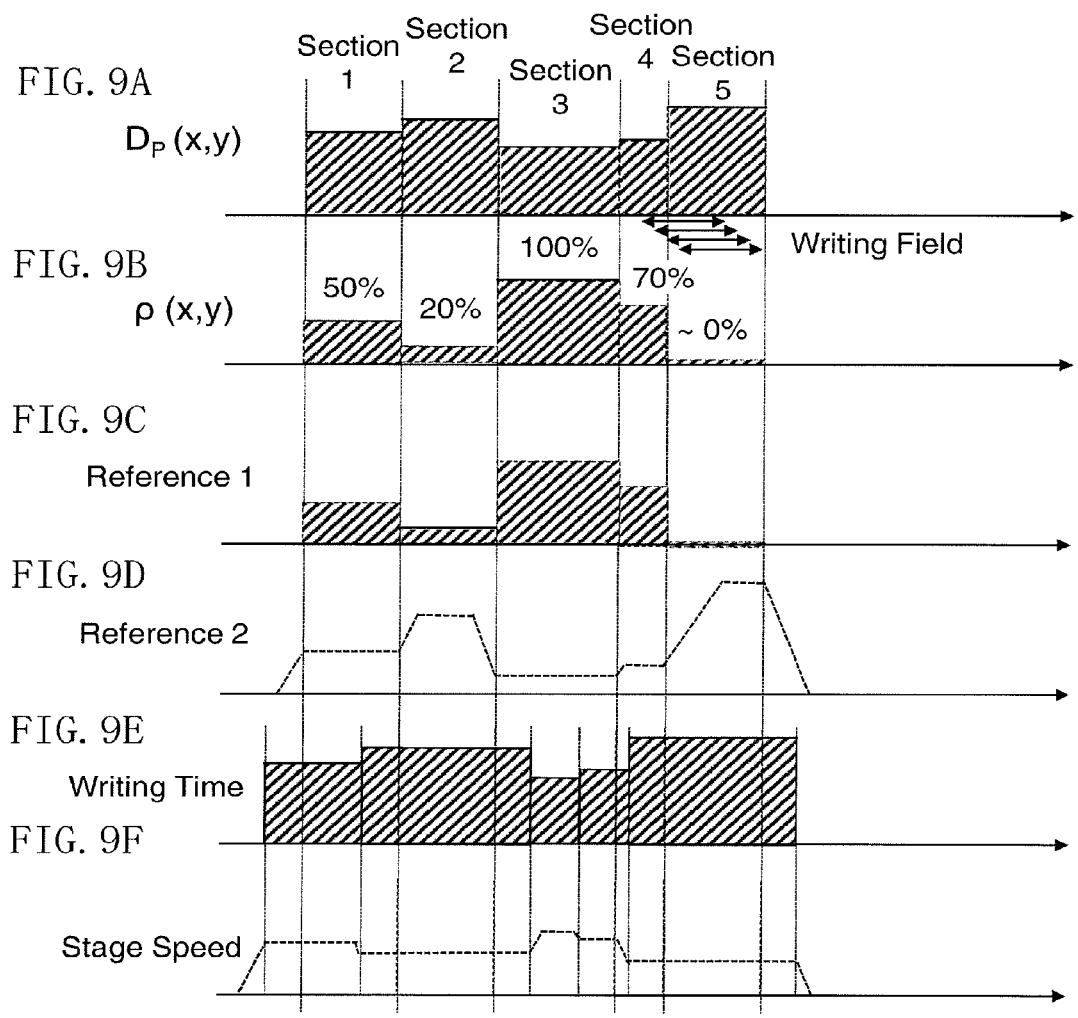

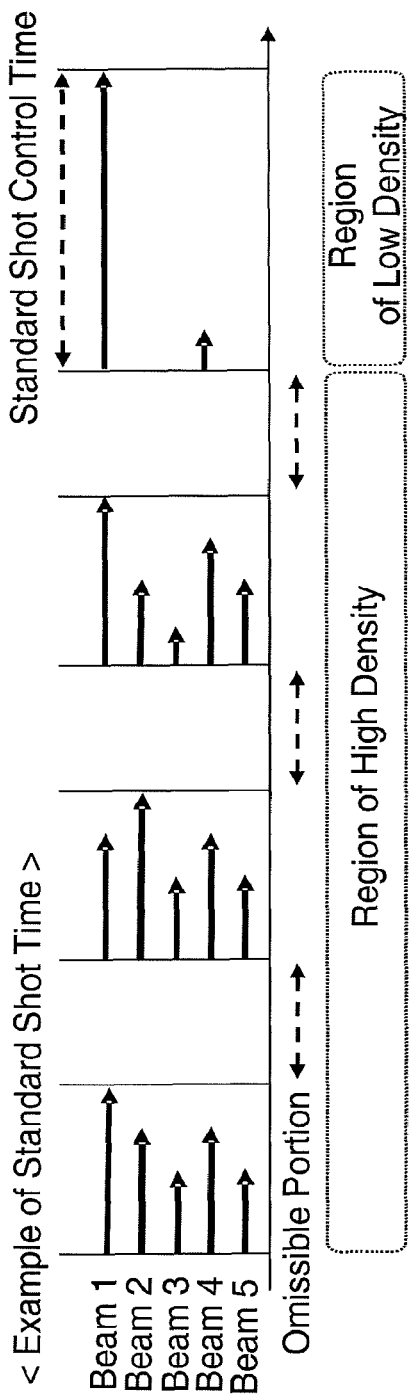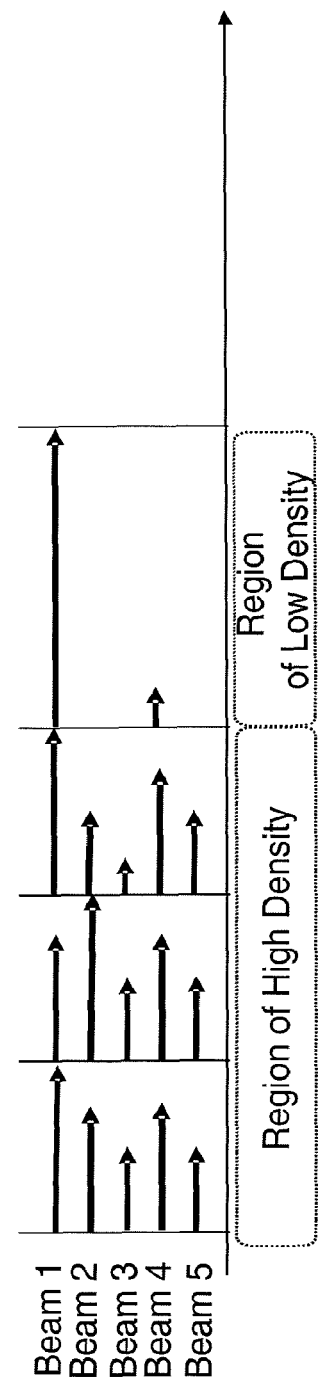
FIG. 10A
FIG. 10B

| k | tk |
|---|---|
| 0 | $\Delta$ |
| 1 | $2\Delta$ |
| 2 | $4\Delta$ |
| 3 | $8\Delta$ |
| 4 | $16\Delta$ |
| 5 | $32\Delta$ |
| 6 | $64\Delta$ |
| 7 | $128\Delta$ |
| 8 | $256\Delta$ |
| 9 | $512\Delta$ |

FIG. 14

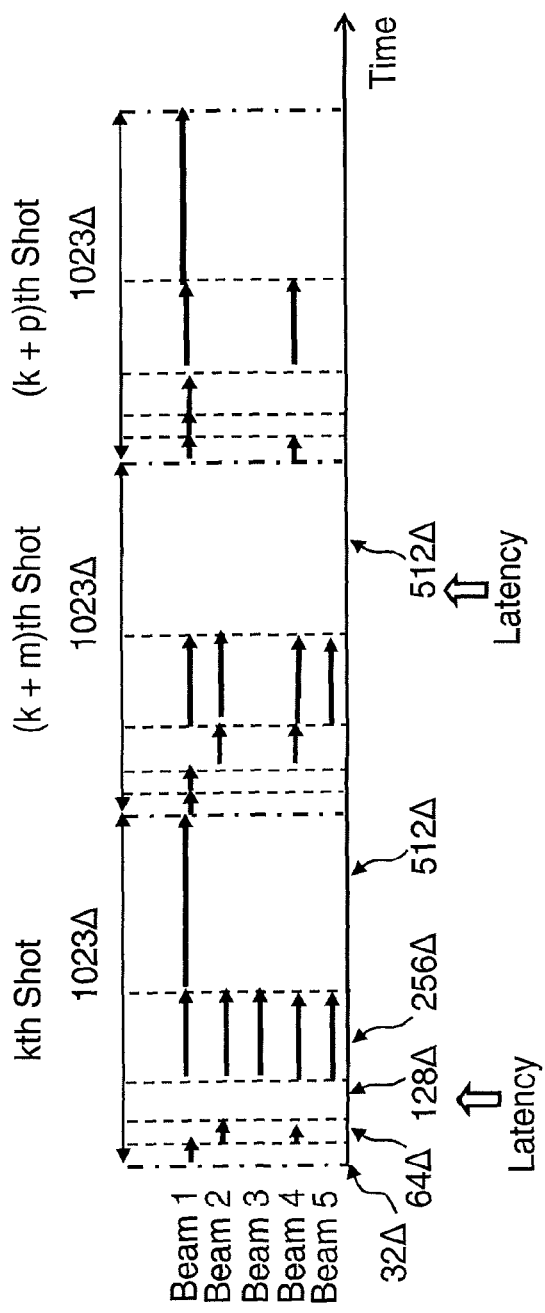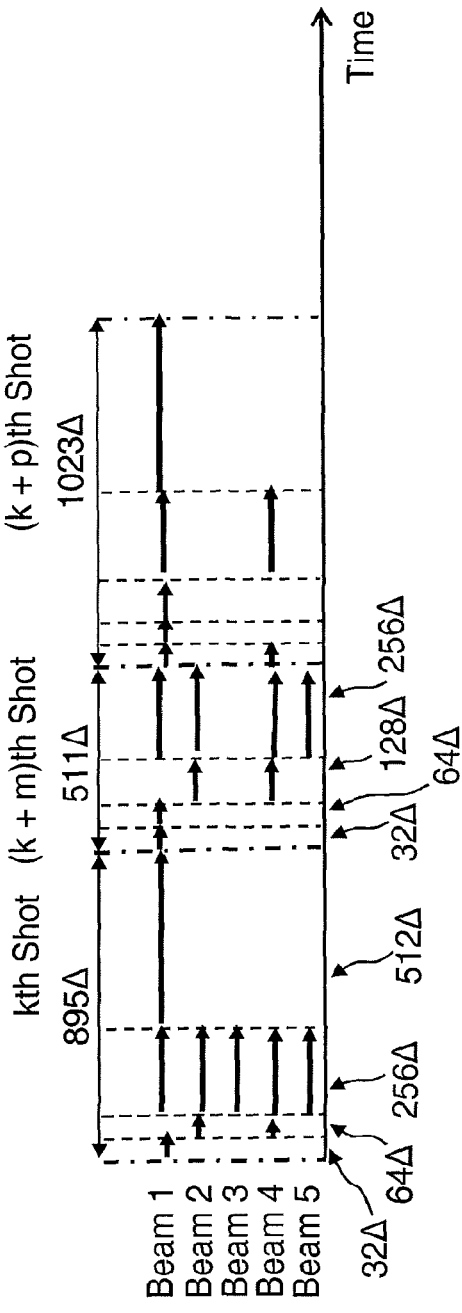
FIG. 15A
FIG. 15B

| Digit | k | k-1 | k-2 | k-3 | . . . |
|---|---|---|---|---|---|
| Beam 1 | 1 | 1 | 0 | 1 | . . . |
| Beam 2 | 1 | 1 | 0 | 0 | . . . |
| Beam 3 | 0 | 1 | 1 | 0 | . . . |
| Beam 4 | 0 | 1 | 1 | 1 | . . . |
| Beam 5 | 1 | 0 | 1 | 1 | . . . |
| ⋮ | | | | | |

FIG. 16

MULTI CHARGED PARTICLE BEAM WRITING APPARATUS AND MULTI CHARGED PARTICLE BEAM WRITING METHOD

CROSS-REFERENCE TO RELATED APPLICATION

This application is based upon and claims the benefit of priority from the prior Japanese Patent Application No. 2015-158747 filed on Aug. 11, 2015 in Japan, the entire contents of which are incorporated herein by reference.

BACKGROUND OF THE INVENTION

Field of the Invention

Embodiments of the present invention relate generally to a multi charged particle beam writing apparatus and a multi charged particle beam writing method, and more specifically, relate, for example, to a control method of the stage used in multi-beam writing.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique, which intrinsically has excellent resolution, is used for writing or "drawing" patterns on a wafer and the like with electron beams.

As a known example of employing the electron beam writing technique, there is a writing apparatus using multi-beams. Since it is possible for multi-beam writing to irradiate multiple beams at a time, the writing throughput can be greatly increased in comparison with single beam writing. A writing apparatus employing the multi-beam technique, for example, forms multi-beams by letting portions of an electron beam emitted from an electron gun pass through a corresponding hole of a plurality of holes in a mask, performs blanking control for each beam, reduces each unblocked beam by an optical system, and deflects it by a deflector so as to irradiate a desired position on a target object or "sample".

The multi-beam writing apparatus employs a method, which is currently under development, of irradiating multi-beams to a plurality of corresponding pixel regions at a time while moving a stage at a constant speed on the basis of a raster scanning system. Although the stage speed is controlled at a constant speed, it may decrease due to turning of the stage at starting or finishing writing a stripe region. On such occasion, if beam on/off control is performed with a fixed shot cycle, the dose becomes excessive due to the stage speed decrease generated at the stage turning. Regarding dose adjustment for preventing such excess of the dose, there is disclosed a method of cutting a superfluous dose by a blanking mechanism (for example, refer to Japanese Unexamined Publication No. JP 2009-532887A). However, it is difficult for this method to perform writing highly accurately and improve the throughput.

If merely the beam on/off control with a fixed shot cycle is performed, dimension errors occur due to proximity effect. Then, aiming at higher accuracy in accordance with recent requirement of miniaturization, proximity effect correction by dose correction needs to be performed. In order to perform proximity effect correction by using a dose, it is necessary to variably control the dose. In addition, in the case of correcting proximity effect by using a dose, it is necessary to increase the dose in the region where the pattern density is low. Therefore, the irradiation time needs to be set long in the region with low pattern density, and to be set short in the region with high pattern density.

On the other hand, when the stage speed is controlled at a constant speed similarly to the conventional raster scanning system, the speed is determined according to the beam whose irradiation time is longest. Therefore, the stage speed is determined according to the region where the irradiation time is long and the pattern density is low. However, in the region where the pattern density is low, writing takes time because the irradiation time is long from the first, and further, if there is a region with no pattern while the stage is moving, latency exists in which merely waiting is performed without irradiating beams. Therefore, in the region with low pattern density, there may occur an inversion phenomenon in that the throughput is lower than that of the single beam writing method of a vector system. With respect to the multi-beam writing apparatus, high throughput performance in the region with high pattern density cancels out the throughput decrease caused by the inversion phenomenon, and increases the total throughput higher than that of the single beam writing method.

However, since the stage speed is determined according to the region where irradiation time is long and pattern density is low, latency to wait for a next shot occurs, even when beam irradiation has been completed, in the region where pattern density is high. Thus, inherent high throughput performance of the multi-beam writing method has not been fully achieved.

BRIEF SUMMARY OF THE INVENTION

According to one aspect of the present invention, a multi charged particle beam writing apparatus includes a writing mechanism configured to include a stage, being movable, for mounting a target object serving as a writing target thereon, and to write a pattern on the target object with multi-beams of a charged particle beam, a maximum irradiation time acquisition processing circuitry configured to acquire, for each shot of the multi-beams, a maximum irradiation time of irradiation time of each beam of the multi-beams, a unit region writing time calculation processing circuitry configured to calculate, using the maximum irradiation time for the each shot, a unit region writing time by totalizing the maximum irradiation time of the each shot of a plurality of times of shots of the multi-beams which irradiate a unit region concerned while the stage is moved, for each unit region of a plurality of unit regions obtained by dividing a writing region of the target object, a stage speed calculation processing circuitry configured to calculate a speed of the stage for the each unit region so that the speed of the stage becomes variable, by using the unit region writing time, and a stage control processing circuitry configured to variably control the speed of the stage.

According to another aspect of the present invention, a multi charged particle beam writing method includes acquiring, for each shot of multi-beams of a charged particle beam, a maximum irradiation time of irradiation time of each beam of the multi-beams; calculating, using the maximum irradiation time for the each shot, a unit region writing time by totalizing the maximum irradiation time of the each shot of a plurality of times of shots of the multi-beams to irradiate a unit region concerned while moving a stage on which a target object is placed, for each unit region of a plurality of unit regions obtained by dividing a writing region of the target object to be written; calculating a speed of the stage for the each unit region by using the unit region writing time so that the speed of the stage becomes variable; and writing a pattern on the target object with the multi-beams of the charged particle beam while variably controlling the speed of the stage.

According to yet another aspect of the present invention, a multi charged particle beam writing method includes writing a pattern on a target object with multi-beams of a charged particle beam while variably controlling a speed of a stage, such that the speed of the stage on which the target object is placed is controlled at high speed when writing a region on the target object of high pattern density of the pattern to be written, and such that the speed of the stage is controlled at low speed when writing a region on the target object of low pattern density.

BRIEF DESCRIPTION OF THE DRAWINGS

FIGS. 8A and 8B show examples illustrating processing for shortening a maximum irradiation time according to the first embodiment;

FIGS. 9A to 9F show examples of the relation between the stage speed and other factors according to the first embodiment;

FIGS. 10A and 10B show the relation between shot time shortening and a pattern density according to the first embodiment;

FIG. 14 is a bit processing table showing the relation between each digit number and an irradiation time of each digit in the case of the digit number n=10 according to the second embodiment;

FIGS. 15A and 15B show examples illustrating processing for shortening a maximum irradiation time according to the second embodiment;

FIG. 16 shows an example of a part of irradiation time array data according to the second embodiment;

DETAILED DESCRIPTION OF THE INVENTION

In the embodiments below, there is described a configuration in which an electron beam is used as an example of a charged particle beam. The charged particle beam is not limited to the electron beam, and other charged particle beam such as an ion beam may also be used.

In the embodiments below, there is described a multi beam writing apparatus and method that is highly accurate and can further increase the throughput performance.

First Embodiment

Figure 1:
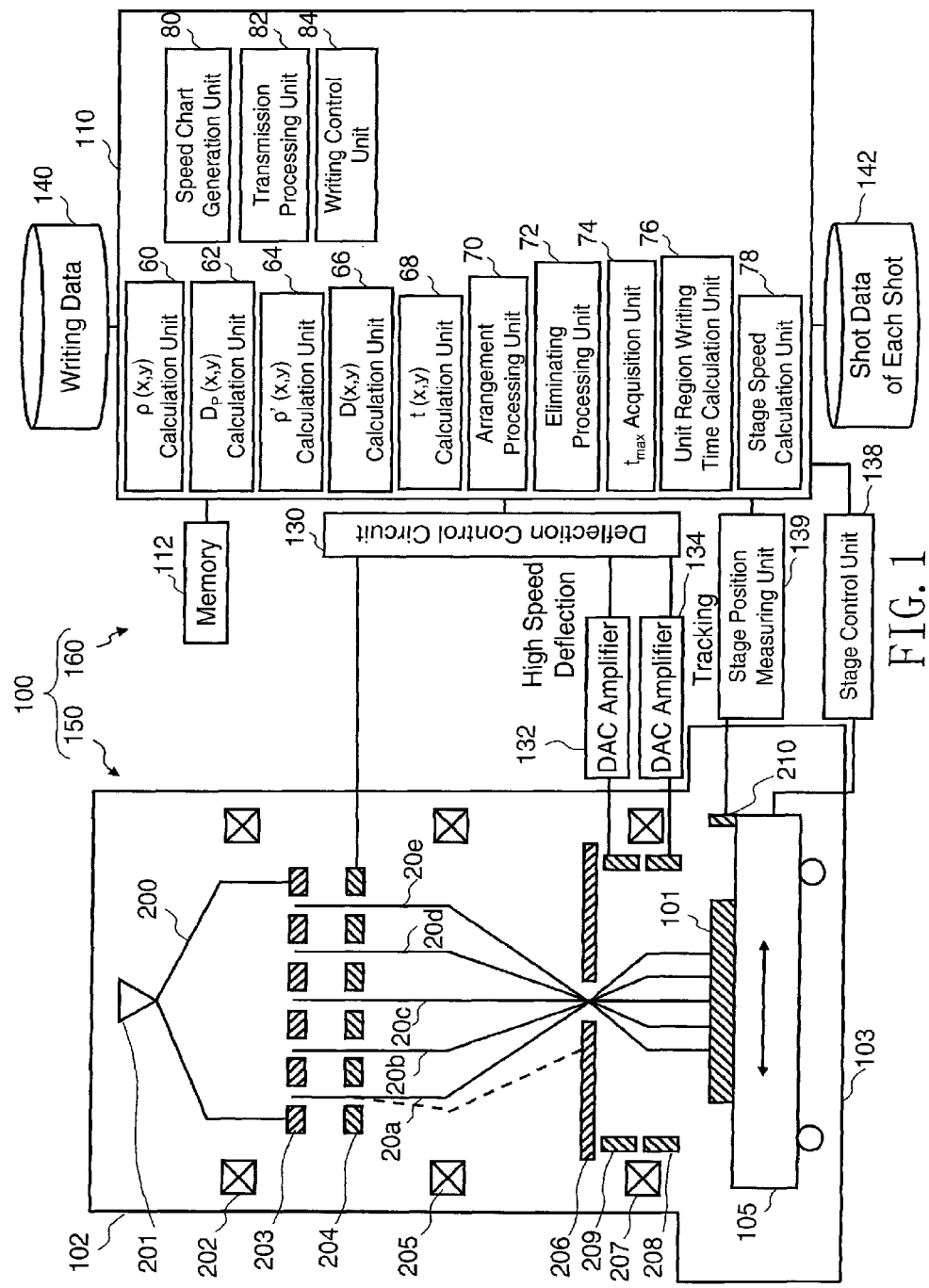
FIG. 1 is a schematic diagram showing a configuration of a writing apparatus according to a first embodiment.

FIG. 1 is a schematic diagram showing a configuration of a writing or "drawing" apparatus according to the first embodiment. As shown in FIG. 1, a writing apparatus 100 includes a writing mechanism 150 and a control unit 160. The writing apparatus 100 is an example of a multi charged particle beam writing apparatus. The writing mechanism 150 includes an electron optical column 102 and a writing chamber 103. In the electron optical column 102, there are arranged an electron gun 201, an illumination lens 202, a forming aperture array substrate 203, a blanking aperture array mechanism 204, a reducing lens 205, a limiting aperture substrate 206, an objective lens 207, and deflectors 208 and 209. In the writing chamber 103, an XY stage 105 is arranged. On the XY stage 105, there is placed a target object or "sample" 101 such as a mask serving as a writing target substrate when writing is performed. For example, the target object 101 is an exposure mask used for manufacturing semiconductor devices, or is a semiconductor substrate (silicon wafer) on which semiconductor elements are formed. The target object 101 may be, for example, a mask blank on which resist has been applied and nothing has yet been written. A mirror 210 for measuring the position of the XY stage 105 is arranged on the XY stage 105.

The control unit 160 includes a control computer 110, a memory 112, a deflection control circuit 130, a DAC (digital-analog converter) amplifier units 132 and 134, a stage control unit 138, a stage position measuring unit 139, and storage devices 140 and 142 such as magnetic disk drives. The control computer 110, the memory 112, the deflection control circuit 130, the stage control unit 138, the stage position measuring unit 139, and the storage devices 140 and 142 are connected with each other through a bus (not shown). Writing data is input from the outside of the writing apparatus 100 into the storage device 140 (storage unit) and stored therein. The deflection control circuit 130 is connected to the DAC amplifier units 132 and 134, and the blanking aperture array mechanism 204 through a bus (not shown).

The stage position measuring unit 139 irradiates the mirror 210 on XY stage 105 with a laser beam, and receives a catoptric light from the mirror 210. Then, the stage position measuring unit 139 measures the position of the XY stage 105 by using information of the catoptric light.

In the control computer 110, there are arranged a pattern area density ρ(x, y) calculation unit 60, a proximity effect correction irradiation coefficient Dp(x, y) calculation unit 62, a pattern area density ρ'(x, y) in pixel calculation unit 64, a dose D(x, y) calculation unit 66, an irradiation time t(x, y) calculation unit 68, an arrangement processing unit 70, an eliminating processing unit 72, a maximum irradiation time $t_{max}$ acquisition unit 74, a unit region writing time calculation unit 76, a stage speed calculation unit 78, a speed chart generation unit 80, a transmission processing unit 82, and a writing control unit 84. Each unit " . . . unit", such as the pattern area density ρ(x, y) calculation unit 60, the proximity effect correction irradiation coefficient Dp(x, y) calculation unit 62, the pattern area density ρ'(x, y) in pixel calculation unit 64, the dose D(x, y) calculation unit 66, the irradiation time t(x, y) calculation unit 68, the arrangement processing unit 70, the eliminating processing unit 72, the maximum irradiation time $t_{max}$ acquisition unit 74, the unit region writing time calculation unit 76, the stage speed calculation unit 78, the speed chart generation unit 80, the transmission processing unit 82, and the writing control unit 84 includes a processing circuitry. As the processing circuitry, for example, an electric circuit, computer, processor, circuit board, quantum circuit, semiconductor device, or the like can be used. Each " . . . unit" may use a common processing circuitry (same processing circuitry), or different processing circuitries (separate processing circuitries). Data which is input and output to/from the pattern area density ρ(x, y) calculation unit 60, the proximity effect correction irradiation coefficient Dp(x, y) calculation unit 62, the pattern area density ρ'(x, y) in pixel calculation unit 64, the dose D(x, y) calculation unit 66, the irradiation time t(x, y) calculation unit 68, the arrangement processing unit 70, the eliminating processing unit 72, the maximum irradiation time $t_{max}$ acquisition unit 74, the unit region writing time calculation unit 76, the stage speed calculation unit 78, the speed chart generation unit 80, the transmission processing unit 82, and the writing control unit 84, and data being operated are stored in the memory 112 each time.

FIG. 1 shows configuration elements necessary for describing the first embodiment. It should be understood that other configuration elements generally necessary for the writing apparatus 100 may also be included therein.

Figure 2:
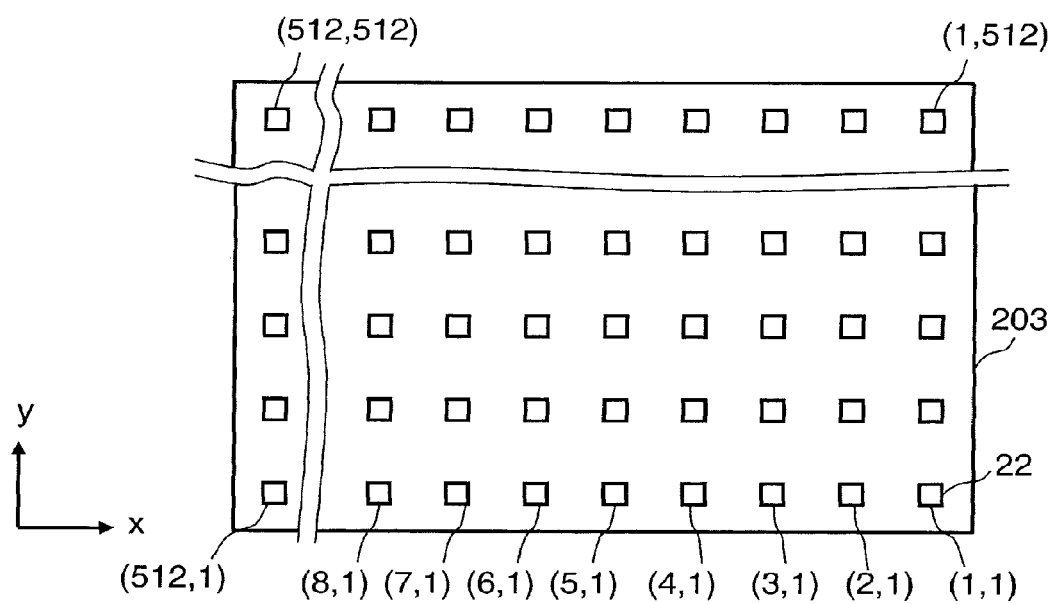
FIG. 2 is a conceptual diagram showing a configuration of a forming aperture array substrate according to the first embodiment.

FIG. 2 is a conceptual diagram showing a configuration of a forming aperture array substrate according to the first embodiment. As shown in FIG. 2, holes (openings) 22 of m rows long (y direction) and n columns wide (x direction) (m≥2, n≥2) are formed, like a matrix, at a predetermined arrangement pitch in the forming aperture array substrate 203. In FIG. 2, for example, holes 22 of 512 (rows in y direction)×512 (columns in x direction) are formed. Each of the holes 22 is a quadrangle of the same dimensional shape. Alternatively, each of the holes 22 can be a circle of the same circumference. Multi-beams 20 are formed by letting portions of an electron beam 200 individually pass through a corresponding hole of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. The method of arranging the holes 22 is not limited to the case of FIG. 2 where holes are arranged like a grid in the length and width directions. For example, with respect to the k-th and the (k+1)th rows arrayed in the length direction (y direction), each hole in the k-th row and each hole in the (k+1)th row may be mutually displaced in the width direction (x direction) by a dimension "a". Similarly, with respect to the (k+1)th and the (k+2)th rows arrayed in the length direction (y direction), each hole in the (k+1)th row and each hole in the (k+2)th row may be mutually displaced in the width direction (x direction) by a dimension "b", for example.

Figure 3:
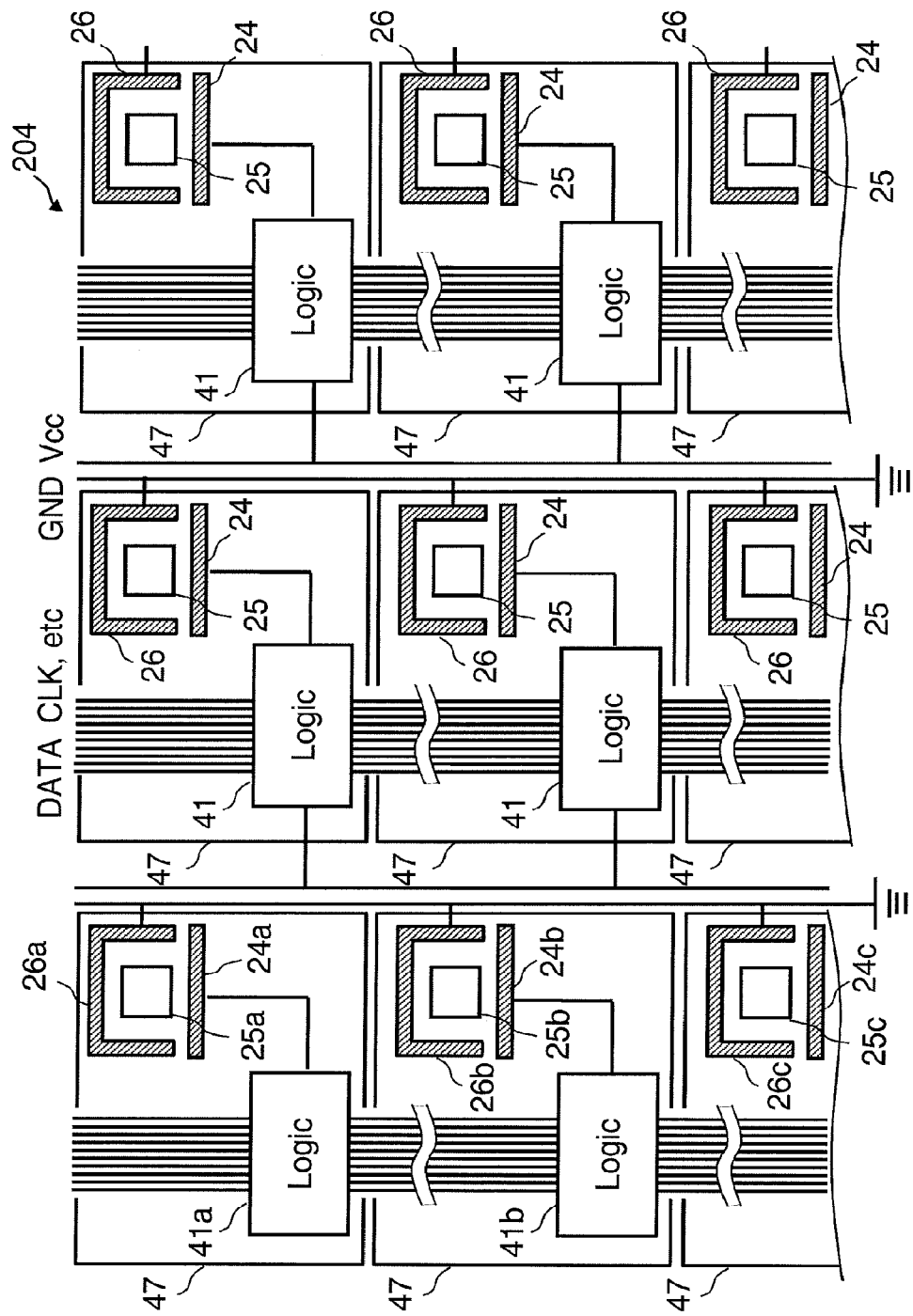
FIG. 3 is a top view conceptual diagram showing a part of a blanking aperture array mechanism according to the first embodiment.

FIG. 3 is a top view conceptual diagram showing a part of a blanking aperture array mechanism according to the first embodiment. In FIG. 3, the positional relation of electrodes 24 and 26 and the positional relation of a control circuit 41 are not in accordance with each other. As shown in FIG. 3, in the blanking aperture array mechanism 204, there are formed passage holes 25 (openings), through which multiple beams individually pass, at the positions each corresponding to each hole 22 of the forming aperture array substrate 203 of FIG. 2. Then, a pair of electrodes 24 and 26 (blanker: blanking deflector) for blanking deflection is arranged close to each passage hole 25 in a manner such that the electrodes 24 and 26 are opposite each other with respect to the passage hole 25 concerned. Moreover, close to each passage hole 25, there is arranged a control circuit 41 (logic circuit) for applying a deflection voltage to, for example, the electrode 24 for each passage hole 25. The other one (the electrode 26, for example) of the two electrodes 24 and 26 for each beam is grounded (earthed). Further, for example, 10-bit parallel lines for control signals are connected to each control circuit 41. In addition to the 10-bit parallel lines, for example, a clock signal line and a power source line are connected to each control circuit 41. A part of the parallel lines may be used as the clock signal line and the power source line. An individual blanking system 47 composed of the electrodes 24 and 26 and the control circuit 41 is configured for each beam of multi-beams. A control signal for each control circuit 41 is output from the deflection control circuit 130. Moreover, a shift register (not shown) is arranged in each control circuit 41, and for example, shift registers for beams in one row of n×m multi beams in the control circuit are connected in series. For example, control signals for beams in one row of the n×m multi beams are transmitted in series. For example, a control signal of each beam is stored in a corresponding control circuit 41 by clock signals of n times.

The electron beam 20 passing through a corresponding passage hole is independently deflected by the voltage applied to the two electrodes 24 and 26 being a pair. Blanking control is performed by this deflection. Blanking deflection is performed for each corresponding beam of the multi-beams. Thus, each of a plurality of blankers performs blanking deflection of a corresponding beam of the multi-beams having passed through a plurality of holes 22 (openings) of the forming aperture array substrate 203.

Figure 4:
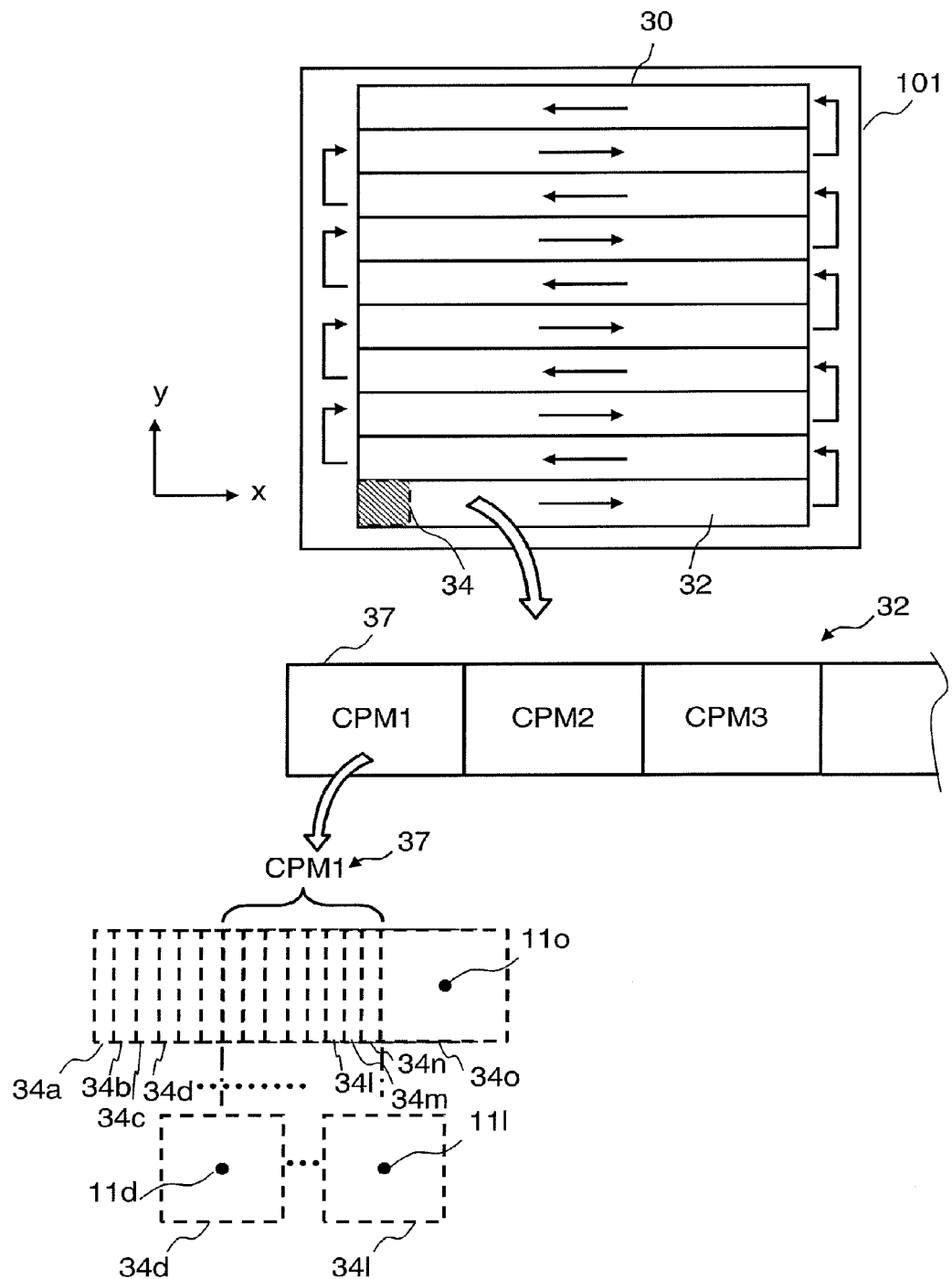
FIG. 4 is a conceptual diagram explaining an example of a writing operation according to the first embodiment.

FIG. 4 is a conceptual diagram explaining an example of a writing operation according to the first embodiment. As shown in FIG. 4, a writing region 30 of the target object 101 is virtually divided into a plurality of stripe regions 32 each in a strip shape and each having a predetermined width in they direction, for example. First, the XY stage 105 is moved to make an adjustment such that an irradiation region 34 which may be irradiated with one irradiation of the multi-beams 20 is located at the left end of the first stripe region 32 or at a position more left than the left end, and then writing is started. For example, when writing the first stripe region 32 by moving the XY stage 105 in the −x direction, the writing advances relatively in the x direction. The XY stage 105 is moved, for example, continuously at a variable speed. After writing the first stripe region 32, the stage position is moved in the −y direction to make an adjustment such that the irradiation region 34 is located at the right end of the second stripe region 32 or at a position more right than the right end and located relatively in the y direction, and then, by moving the XY stage 105 in the x direction, for example, writing advances in the −x direction. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also preferable to perform writing in the same direction when writing each stripe region 32. A plurality of shot patterns are generated at a time by one shot of multi-beams which have been formed by passing through each of the holes 22 of the forming aperture array substrate 203, that is, the number of shot patterns generated at a time is equal to the number of the holes 22 at the maximum.

Figure 5:
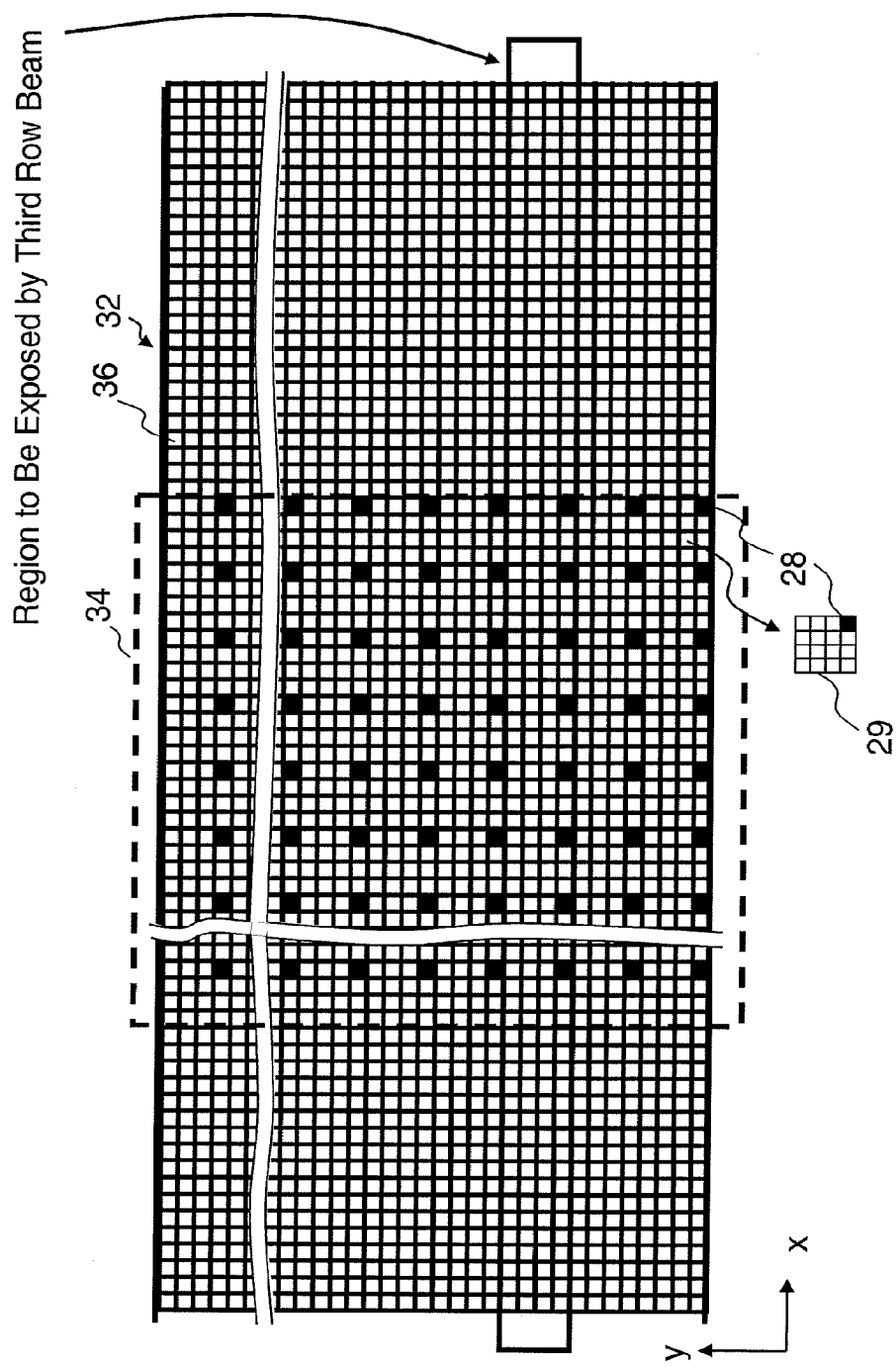
FIG. 5 shows an example of an irradiation region of multi-beams and a pixel to be written according to the first embodiment.

FIG. 5 shows an example of an irradiation region of multi-beams and a pixel to be written (writing target pixel) according to the first embodiment. In FIG. 5, the stripe region 32 is divided into a plurality of mesh regions by the beam size of multi-beams, for example. Each mesh region serves as a writing target pixel 36 (writing position). The size of the writing target pixel 36 is not limited to the beam size, it may be an arbitrary size regardless of the beam size. For example, it may be 1/n (n being an integer of 1 or more) of the beam size. FIG. 5 shows the case where the writing region of the target object 101 is divided in the y direction into a plurality of stripe regions 32 by the width size being substantially the same as the size of the irradiation region 34 which can be irradiated by one irradiation of the multi-beam 20, for example. The width of the stripe region 32 is not limited to this. It is also preferable for the width of the stripe region 32 to be n times (n being an integer of 1 or more) the size of the irradiation region 34. FIG. 5 shows the case of multi-beams of 512×512 (rows by columns). In the irradiation region 34, there are shown a plurality of pixels 28 (writing positions of beams) which can be irradiated by one irradiation of the multi-beams 20. In other words, the pitch between the adjacent pixels 28 is the pitch between beams of the multi-beams. In the example of FIG. 5, one grid 29 is a square region surrounded at four corners by four adjacent pixels 28, and it includes one of the four pixels 28. In the example of FIG. 5, each grid 29 is configured by 4×4 pixels.

Figure 6:
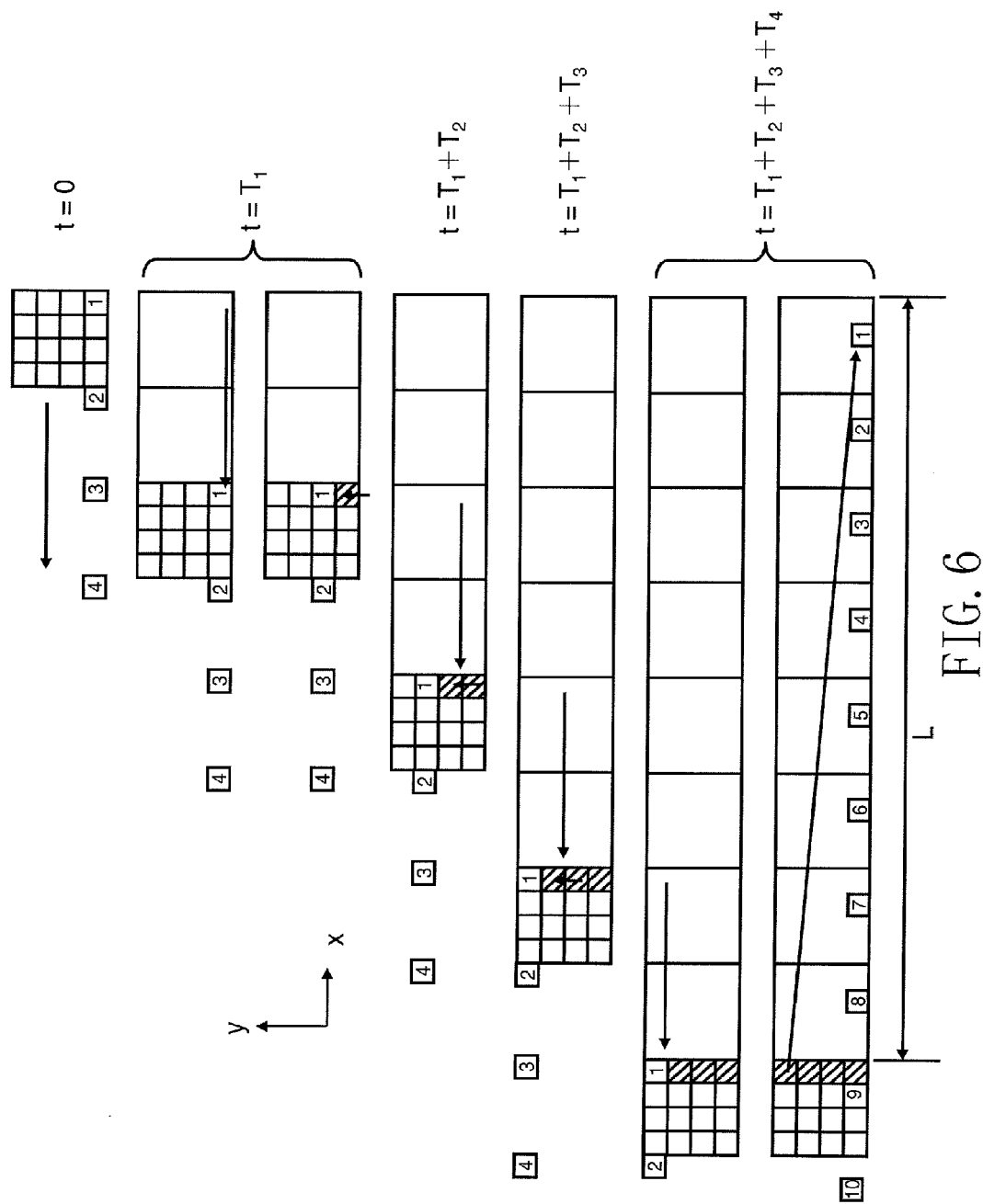
FIG. 6 shows an example illustrating a writing method of multi-beams according to the first embodiment.

FIG. 6 illustrates an example of a writing method of multi-beams according to the first embodiment. FIG. 6 shows some grids to be written by respective beams at the coordinates (1, 3), (2, 3), (3, 3), . . . , (512, 3) in the third row in the y direction from the bottom in the multi-beams for writing the stripe region 32 shown in FIG. 5. In the example of FIG. 6, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 in a manner where the entire multi-beams 20 is collectively deflected by the deflector 208. In other words, tracking control is performed.

In the example of FIG. 6, one tracking cycle is executed by writing (exposing) four pixels while moving the distance of eight beam pitches.

Specifically, the stage position detector 139 measures the position of the XY stage 105 by irradiating a laser onto the mirror 210 and receiving a catoptric light from the mirror 210. The measured position of the XY stage 105 is output to the control computer 110. In the control computer 110, the writing control unit 84 outputs the position information on the XY stage 105 to the deflection control circuit 130. The deflection control circuit 130 calculates deflection amount data (tracking deflection data) for performing beam deflection to follow the movement of the XY stage 105. The tracking deflection data being a digital signal is output to the DAC amplifier 134. The DAC amplifier 134 converts the digital signal to an analog signal and amplifies it to be applied as a tracking deflection voltage to the main deflector 208.

The writing mechanism 150 emits beams in the "on" state in the multi-beams 20 of the shot concerned to a corresponding writing position of each beam during a corresponding writing time period within the maximum writing time T of the irradiation time period of each beam. Specifically, it operates as described below.

The electron beam 200 emitted from the electron gun 201 (emitter) almost perpendicularly (vertically) illuminates the whole of the forming aperture array substrate 203 by the illumination lens 202. A plurality of holes (openings) each being a quadrangle are formed in the forming aperture array substrate 203. The region including all the plurality of holes 22 is irradiated by the electron beam 200. For example, a plurality of quadrangular electron beams (multi-beams) 20a to 20e are formed by letting portions of the electron beam 200, which irradiates the positions of a plurality of holes 22, individually pass through a corresponding hole of the plurality of holes 22 of the forming aperture array substrate 203. The multi-beams 20a to 20e individually pass through corresponding blankers (first deflector: individual blanking mechanism) of the blanking aperture array mechanism 204. Each blanker deflects (performs blanking deflection) an individually passing electron beam 20 to be beam "ON" during a calculated writing time (irradiation time) and to be beam "off" during the other time period.

The multi-beams 20a, 20b, . . . , 20e having passed through the blanking aperture array mechanism 204 are reduced by the reducing lens 205, and go toward the hole in the center of the limiting aperture substrate 206. At this stage, the electron beam 20 which was deflected to be beam "off" by the blanker of the blanking aperture array mechanism 204 deviates from the hole in the center of the limiting aperture substrate 206 (blanking aperture substrate) and is blocked by the limiting aperture substrate 206. On the other hand, the electron beam 20 which was not deflected by the blanker of the blanking aperture array mechanism 204 or was deflected to be beam "on" passes through the hole in the center of the limiting aperture substrate 206 as shown in FIG. 1. Blanking control is performed by on/off of the individual blanking mechanism so as to control on/off of the beam. Thus, the limiting aperture substrate 206 blocks each beam which was deflected to be the "off" state beam by the individual blanking mechanism. Then, one shot beam is formed by a beam which has been made during a period from becoming a beam "on" state to becoming a beam "off" state and has passed through the limiting aperture substrate 206. The multi-beams 20 having passed through the limiting aperture substrate 206 are focused by the objective lens 207 so as to be a pattern image of a desired reduction ratio.

Respective beams (the whole of the multi-beams 20) having passed through the limiting aperture substrate 206 are collectively deflected in the same direction by the deflectors 208 and 209 in order to irradiate writing positions (irradiation positions) of the respective beams on the target object 101. The multi-beams 20 to irradiate the positions at a time (same time) are ideally aligned at pitches obtained by multiplying the arrangement pitch of a plurality of holes of the forming aperture array substrate 203 by the desired reduction ratio described above. The writing apparatus 100 performs a writing operation by a method of sequentially irradiating shot beams while shifting the writing position, and when writing a desired pattern, controls a beam required according to a pattern to be beam "on" by blanking control.

In the example of FIG. 6, for example, the first pixel from the right in the first row from the bottom of the grid 29 concerned ("target grid" or "grid of interest") is irradiated by the first shot of a beam (1) of coordinates (1, 3) during the time from t=0 to t=$T_1$ being the maximum writing time. The XY stage 105 moves two beam pitches in the −x direction during the time from t=0 to t=$T_1$, for example. During this time period, the tracking operation is continuously performed.

After the maximum writing time $T_1$ has passed since the start of beam irradiation of the shot concerned, while the beam deflection for tracking control is being continuously performed by the deflector 208, the writing position (previous writing position) of each beam is shifted to a next writing position (current writing position) of each beam by collectively deflecting the multi-beams 20 by the deflector 209, which is performed in addition to the beam deflection for tracking control. In the example of FIG. 6, when the time becomes t=$T_1$, the pixel to be written (writing target pixel) is shifted from the first pixel from the right in the first row from the bottom of the grid 29 concerned to the first pixel from the right in the second row from the bottom. Since the XY stage 105 is moving at a fixed speed also during this time period, the tracking operation is continuously performed.

Then, while the tracking control is continued, respective beams in the "on" state in the multi-beams 20 are applied to shifted writing positions corresponding to the respective beams during a writing time corresponding to each of the respective beams within a maximum writing time $T_2$ of the shot concerned. In the example of FIG. 6, the first pixel from the right in the second row from the bottom of the grid 29 concerned is irradiated by the second shot of the beam (1) of coordinates (1, 3) during the time from t=$T_1$ to t=$T_1+T_2$, for example. The XY stage 105 moves two beam pitches in the −x direction during the time from t=$T_1$ to t=$T_1+T_2$, for example. During this time period, the tracking operation is continuously performed.

In the example of FIG. 6, when the time becomes t=$T_1+T_2$, the pixel to be written (writing target pixel) is shifted from the first pixel from the right in the second row from the bottom of the grid 29 concerned to the first pixel from the right in the third row from the bottom by collectively deflecting the multi-beams by the deflector 209. Since the XY stage 105 is moving also during this time period, the tracking operation is continuously performed. Then, the first pixel from the right in the third row from the bottom of the grid 29 concerned is irradiated by the third shot of the beam (1) of coordinates (1, 3) during the time from t=$T_1+T_2$ to t=$T_1+T_2+T_3$, for example. The XY stage 105 moves two beam pitches in the −x direction during the time from t=$T_1+T_2$ to t=$T_1+T_2+T_3$, for example. During this time period, the tracking operation is continuously performed. When the time becomes t=$T_1+T_2+T_3$, the pixel to be written (writing target pixel) is shifted from the first pixel from the right in the third row from the bottom of the grid 29 concerned to the first pixel from the right in the fourth row from the bottom by collectively deflecting the multi-beams by the deflector 209. Since the XY stage 105 is moving also during this time period, the tracking operation is continuously performed. Then, the first pixel from the right in the fourth row from the bottom of the grid 29 concerned is irradiated by the fourth shot of the beam (1) of coordinates (1, 3) during the time from t=$T_1+T_2+T_3$ to t=$T_1+T_2+T_3+T_4$, for example. The XY stage 105 moves two beam pitches in the −x direction during the time from t=$T_1+T_2+T_3$ to t=$T_1+T_2+T_3+T_4$, for example. During this time period, the tracking operation is continuously performed. By the process described above, writing of the pixels in the first column from the right of the grid 29 concerned has been completed.

In the example of FIG. 6, after emitting a corresponding beam to the writing position of each beam which has been shifted three times from the initial position, the DAC amplifier 134 returns the tracking position to the start position of tracking where the tracking control was started, by resetting the beam deflection for tracking control. In other words, the tracking position is returned in the opposite direction to the direction of the stage movement. In the example of FIG. 6, when the time becomes t=$T_1+T_2+T_3+T_4$, tracking of the grid 29 concerned is released (removed), and the beam is swung back to a new target grid which has been shifted by eight beam pitches in the x direction. Although the beam (1) of the coordinates (1,3) has been described in the example of FIG. 6, writing is also similarly performed for each grid corresponding to a beam of other coordinates. That is, a beam of coordinates (n, m) completes writing of pixels in the first column from the right of a corresponding grid when the time becomes t=$T_1+T_2+T_3+T_4$. For example, a beam (2) of coordinates (2,3) completes writing of pixels in the first column from the right of a grid adjacent in the −x direction to the grid 29 concerned for the beam (1) of FIG. 6.

Since writing of the pixels in the first column from the right of each grid has been completed, in a next tracking cycle after resetting the tracking, the deflector 209 performs deflection such that the writing position of each corresponding beam is adjusted (shifted) to the second pixel from the right in the first row from the bottom of each grid.

As described above, each shot is performed while shifting the irradiation position pixel by pixel by the deflector 209, in a state such that the relative position of the irradiation region 34 to the target object 101 is controlled by the deflector 208 to be unchanged during the same tracking cycle. Then, after finishing one tracking cycle and returning the tracking position of the irradiation region 34, as shown in the lower part of FIG. 4, the first shot position is adjusted to be the position shifted by one pixel, for example. Then, while performing a next tracking control, each shot is performed shifting the irradiation position by one pixel by the deflector 209. By repeating this operation during writing the stripe region 32, the position of the irradiation region 34 is shifted one by one, such as from 34*a* to 34*o*, to perform writing of the stripe region concerned.

If this operation is performed by a raster scanning system whereby the stage moves at a constant speed, it becomes $T_1=T_2=T_3=T_4$, but, according to the first embodiment, the maximum irradiation time of the shot concerned is set as variable for each shot. Moreover, the speed of the XY stage 105 is controlled to be variable. According to the first embodiment, as shown in the middle of FIG. 4, the stripe region 32 is divided into a plurality of compartment (CPM) regions 37 (an example of a unit region). Then, the speed of the XY stage 105 is variably set for each CPM region 37. The size of the CPM region 37 may be an arbitrary size in the x direction (lengthwise direction of the stripe region 32). It is more preferable to set the size of the CPM region 37 to be equal to or larger than the irradiated region 34. The size in the x direction (lengthwise direction of the stripe region 32) of each CPM region 37 may the same as each other or different from each other. The size in the y direction (breadthwise direction of the stripe region 32) of each CPM region 37 is set to be the same in one stripe region 32. Therefore, it is preferable for the y direction size of the CPM region 37 to be the same as that of the stripe region 32.

Figure 7:
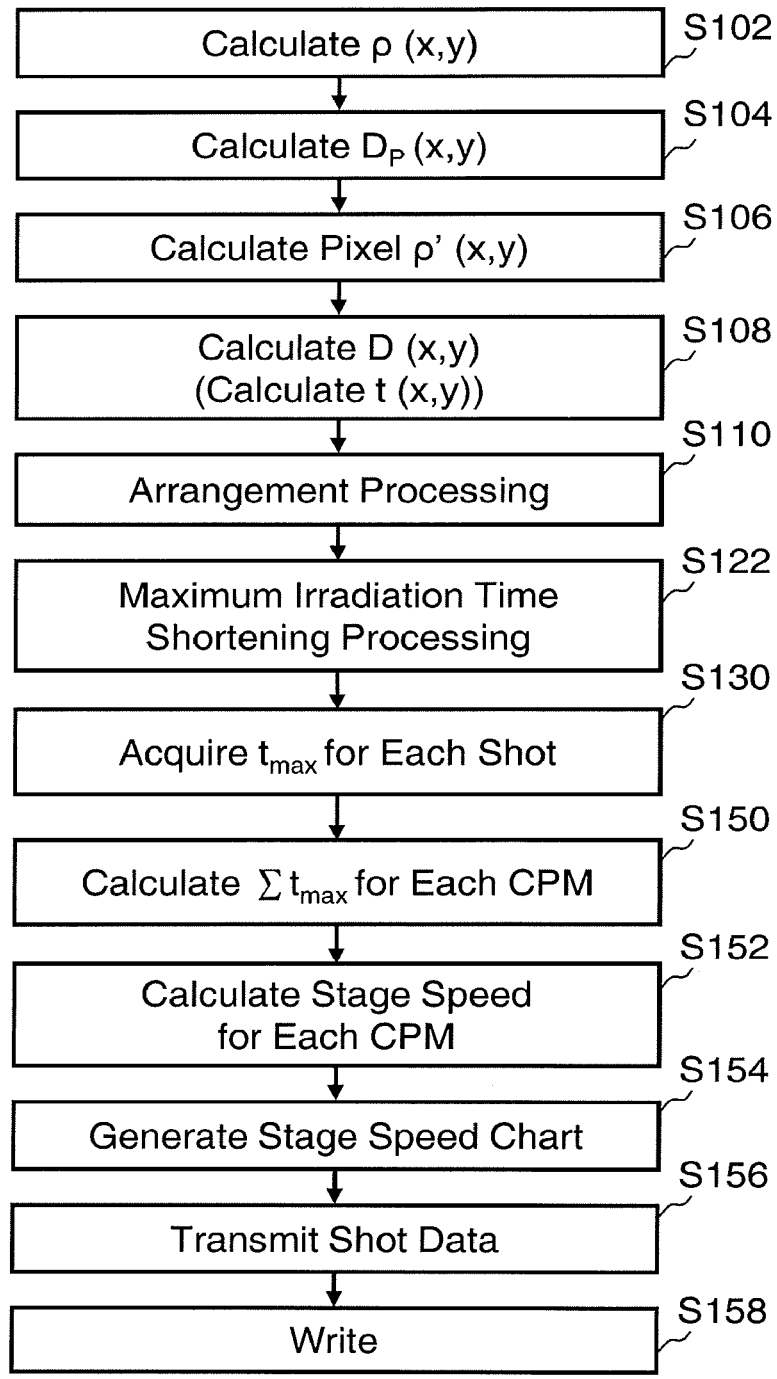
FIG. 7 is a flowchart showing main steps of a writing method according to the first embodiment.

FIG. 7 is a flowchart showing main steps of a writing method according to the first embodiment. As shown in FIG. 7, the writing method according to the first embodiment executes a series of steps: a pattern area density $\rho(x, y)$ calculation step (S102), a proximity effect correction irradiation coefficient $Dp(x, y)$ calculation step (S104), a pattern area density $\rho'(x, y)$ in pixel calculation step (S106), a dose $D(x, y)$ calculation and irradiation time $t(x, y)$ calculation step (S108), an arrangement processing step (S110), a maximum irradiation time shortening processing step (S122), a maximum irradiation time $t_{max}$ acquisition step (S130) for each shot, a unit region writing time calculation step (S150), a stage speed calculation step (S152), a stage speed chart generation step (S154), a data transmission processing step (S156), and a writing step (S158).

The writing region 30 (or chip region to be written) of the target object 101 is divided into strip-shaped stripe regions 32 (another example of the writing region) each having a predetermined width. Then, each stripe region 32 is divided into a plurality of mesh-shaped pixel regions 36 (pixels). Preferably, the size of the pixel region 36 (pixel) is, for example, a beam size, or smaller than a beam size. For example, the size of the pixel region is preferably about 10 nm. The pixel region 36 (pixel) serves as a unit region for irradiation per beam of multi-beams. Each stripe region 32 is divided into a plurality of CPM regions 37 described above.

In the $\rho(x, y)$ calculation step (S102), the $\rho(x, y)$ calculation unit 60 virtually divides the writing region (here, for example, stripe region 35) into a plurality of proximity mesh regions (mesh regions for proximity effect correction calculation) by a predetermined size. The size of the proximity mesh region is preferably about 1/10 of the influence radius of the proximity effect, such as about 1 μm. The $\rho(x, y)$ calculation unit 60 reads writing data from the storage device 140, and calculates, for each proximity mesh region, a pattern area density $\rho(x, y)$ of a pattern arranged in the proximity mesh region concerned.

In the $Dp(x, y)$ calculation step (S104), the $Dp(x, y)$ calculation unit 62 calculates, for each proximity mesh region, a proximity effect correction irradiation coefficient $Dp(x, y)$ for correcting a proximity effect. Here, the size of the mesh region to calculate the proximity effect correction irradiation coefficient $Dp(x, y)$ does not need to be the same as that of the mesh region to calculate a pattern area density $\rho(x, y)$. Moreover, the correction model of the proximity effect correction irradiation coefficient $Dp(x, y)$ and its calculation method may be the same as those used in the conventional single beam writing system.

In the $\rho'(x, y)$ calculation step (S106), the $\rho'(x, y)$ calculation unit 64 calculates, for each pixel region 36, a pattern area density $\rho'(x, y)$ in the pixel region 36 concerned.

In the dose $D(x, y)$ calculation and irradiation time $t(x, y)$ calculation step (S108), first, the $D(x, y)$ calculation unit 66 calculates, for each pixel region (writing target pixel) 36, a dose $D(x, y)$ for irradiating the pixel region 36 concerned. The dose $D(x, y)$ can be calculated, for example, by multiplying a pre-set reference dose $D_{base}$, a proximity effect correction irradiation coefficient $Dp(x, y)$, and a pattern area density $\rho'(x, y)$. Thus, it is preferable to obtain the dose $D(x, y)$ to be in proportion to a pattern area density calculated for each pixel region 36. Next, the $t(x, y)$ calculation unit 68 calculates, for each pixel region 36, an electron beam irradiation time $t(x, y)$ for making the calculated dose $D(x, y)$ incident on the pixel region 36 concerned. The irradiation time $t(x, y)$ can be calculated by dividing the dose $D(x, y)$ by a current density J. Moreover, the $t(x, y)$ calculation unit 68 calculates gray scale data being integers by dividing the irradiation time $t(x, y)$ acquired for each pixel region 36 by a quantization unit $\Delta$ (gray scale resolution). The gray scale data is defined by gray scale values from 0 to 1023, for example. The quantization unit $\Delta$ can be variously set, and, for example, it can be defined by 1 ns (nanosecond), etc. It is preferable that a value of 1 to 10 ns, for example, is used as the quantization unit $\Delta$.

In the arrangement processing step (S110), the arrangement processing unit 70 rearranges (performs arrangement processing) irradiation time data of each pixel region 36 in the order of shots. Which beam of the multi-beams 20 irradiates which pixel region 36 on the target object 101 is determined based on the writing sequence. The gray scale data acquired for each pixel region 36, on which the arrangement processing has been performed in the order of shots, is stored as irradiation time data (shot data) in the storage device 142.

In the maximum irradiation time shortening processing step (S122), the eliminating processing unit 72 performs, for each shot, processing for shortening the maximum irradiation time by eliminating unnecessary latency time.

FIGS. 8A and 8B show examples illustrating processing for shortening a maximum irradiation time according to the first embodiment. FIG. 8A shows the case where $1023\Delta$ is uniformly set as the maximum irradiation time for each shot. The examples of FIG. 8A show the irradiation time of each beam (here, beams 1 to 5) of the k-th shot, the irradiation time of each beam of the (k+m)th shot, and the irradiation time of each beam of the (k+p)th shot which are continuously emitted in the case of setting $1023\Delta$ as the maximum irradiation time. With respect to the k-th shot, the irradiation time of the beam 1 is $768\Delta$ being the maximum. Therefore, in the k-th shot, after the time of $768\Delta$ has passed, each time of $255\Delta$ ($=1023\Delta-768\Delta$) is a latency time without irradiating any beam. With respect to the (k+m)th shot, the irradiation time of the beam 2 is the maximum. Therefore, in the (k+m)th shot, each time between just after the irradiation time of the beam 2 has passed and just before the time becomes $1023\Delta$ is latency time without irradiating any beam. With respect to the (k+p)th shot, the irradiation time of the beam 1 is $1023\Delta$ being the maximum. Therefore, in the (k+p)th shot, there is no latency time without irradiating any beam and thus the original maximum irradiation time is needed for the shot.

The eliminating processing unit 72 performs, for each shot, processing for eliminating the latency time. In the example of FIG. 8B, with respect to the k-th shot, each time between just after the irradiation time of the beam 1 has passed and just before the time becomes $1023\Delta$ is latency time. Therefore, this latency time is eliminated for the k-th shot. Consequently, the writing time can be reduced by this latency time with respect to the k-th shot. With respect to the (k+m)th shot, each time between just after the irradiation time of the beam 2 has passed and just before the time becomes 1023Δ is latency time. Therefore, this latency time is eliminated for the (k+m)th shot. Consequently, the writing time can be reduced by this latency time with respect to the (k+m)th shot. With respect to the (k+p)th shot, since there is no latency time, no reduction can be performed. As described above, processing to shorten the maximum irradiation time is performed for all the shots.

In the maximum irradiation time $t_{max}$ acquisition step (S130) for each shot, the $t_{max}$ acquisition unit 74 acquires, for each shot of the multi-beams 20, the maximum irradiation time $t_{max}$ of the irradiation time of each beam of the multi-beams 20. For example, with respect to the k-th shot in the example of FIG. 8B, the maximum irradiation time 768Δ (irradiation time of beam 1) after being shortened serves as the maximum irradiation time $t_{max}$.

In the unit region writing time calculation step (S150), using the maximum irradiation time $t_{max}$ calculated for each shot, the unit region writing time calculation unit 76 calculates a unit region writing time by totalizing the maximum irradiation time $t_{max}$ of each shot of a plurality of times of shots of the multi-beams 20 which irradiate the CPM region 37 concerned while the XY stage 105 is moved, for each CPM region 37 (unit region) of a plurality of CPM regions 37 obtained by dividing the writing region (for example, stripe region 32) of the target object 101. A reference position of the entire irradiation region 34 (irradiatable region) which one-time shot of the multi-beams 20 is able to irradiate overlaps with a CPM region 37 of the plurality of the CPM regions 37. Then, each shot of the multi-beams 20 belongs as a part to the plurality of times of shots of the multi-beams 20 to irradiate the CPM region 37 with which the reference position of a corresponding shot overlaps. The example of the lower part of FIG. 4 shows positional relation between CPM1 (CPM region 37) and each of the irradiation regions 34a to 34o. In the example of the lower part of FIG. 4, the CPM1 (CPM region 37) is written by the shots individually performed in the irradiation regions 34b to 34n. According to the first embodiment, whether becoming a plurality of times of shots for writing the CPM1 is determined based on whether reference positions 11a to 11o of the irradiation regions 34a to 34o are included in the CPM1. Preferably, the reference position 11 is set at the center position of the irradiation region 34 concerned, for example. In the example of the lower part of FIG. 4, since the reference positions 11 of the irradiation regions 34d to 34l in the irradiation regions 34a to 34o are included in the CPM1, a plurality of shots emitted on the irradiation regions 34d to 34l become the shots used for calculating the writing time of the CPM region 37 concerned. In the example of FIG. 6, each four shots executed during the shot cycle of each of the irradiation regions 34d to 34l become the shots used for calculating the writing time of the CPM region 37 concerned. The unit region writing time of each CPM region 37 can be calculated by $\Sigma t_{max}$ obtained by totalizing the maximum irradiation time $t_{max}$ of each shot for the CPM region 37 concerned. Since the shift time at the writing position is usually substantially smaller than the maximum irradiation time of each shot, it can be ignored. However, when it is not ignorable, the writing time should be calculated including the shift time at the writing position. In the above description, the maximum irradiation time is calculated for each shot in the writing region along with the advancement of writing, and then, the writing time of a CPM region is obtained by integrating the maximum irradiation time in the case of the reference position being included in the CPM region. As a more simplified way, the writing time of a CPM region can be set by calculating, for each CPM region, the maximum irradiation time for a writing pattern in the CPM region concerned in order to write the whole CPM region by using this maximum irradiation time, which leads to a sufficient effect. Further, more simply, since the dose (namely, irradiation time) is determined based on a proximity effect correction coefficient and a pattern density, the writing time (corresponding to the stage speed) per unit region which can be assumed (estimated) from a pattern density is previously set in accordance with the relation between the pattern density and the maximum irradiation time, and then, according to this set unit region writing time, the writing time is directly determined from the pattern density per CPM, which leads to the same effect. In this method, the maximum irradiation time is indirectly derived and utilized to determine the writing time of each CPM region because the relationship between the maximum irradiation time and the pattern density is arranged in advance. These ways can be selectively determined depending on performance requirement.

In the stage speed calculation step (S152), the stage speed calculation unit 78 calculates the speed of the XY stage 105 for each CPM region 37 by using the unit region writing time so that the stage speed may be variable. Specifically, the stage speed of the CPM region 37 concerned can be calculated by dividing the size in the stage movement direction (x direction) of the CPM region 37 concerned by the unit region writing time of the CPM region 37 concerned. Since the unit region writing time may be different from each other for each CPM region 37, the stage speed becomes variable.

In the stage speed chart generation step (S154), the speed chart generation unit 80 generates a stage speed chart by using the stage speed of each CPM region 37

FIGS. 9A to 9F show examples of the relation between the stage speed and other factors according to the first embodiment. In FIG. 9A, the ordinate axis represents the value of a proximity effect correction irradiation coefficient $D_p(x, y)$, and the abscissa axis represents an x direction position. FIG. 9A shows an example of the value of the proximity effect correction irradiation coefficient $D_p(x, y)$ for each CPM region 37 (section). Although the $D_p(x, y)$ may be various values for usual writing patterns in the CPM region 37, it is here typically set to be constant in the region. In the example of FIG. 9A, the range in which the value of the proximity effect correction irradiation coefficient $D_p(x, y)$ is constant is set as one CPM region 37. Therefore, in the example of FIG. 9A, the width sizes in the writing advancing direction (x direction) of the CPM regions 37 are different from each other. FIG. 9B shows an example of a pattern area density $\rho(x, y)$ corresponding to each of the CPM regions 37 (sections) of FIG. 9A. As shown in FIGS. 9A and 9B, it turns out that the value of the proximity effect correction irradiation coefficient $D_p(x, y)$ of the CPM region 37 (section) of low pattern area density $\rho(x, y)$ is greater than that of the CPM region 37 of high pattern area density $\rho(x, y)$. This is because, in order to perform proximity effect correction, since the exposure amount received by a reflection electron at the time of writing is smaller in the region of low pattern area density, it is necessary to increase the dose so as to make the exposure amount be equivalent to that of the region of high pattern area density. In other words, the irradiation time of the CPM region 37 (section) of low pattern area density $\rho(x, y)$ is longer than that of the CPM region 37 of high pattern area density $\rho(x, y)$. In order to compare with the conventional single beam case, FIG. 9C shows, for reference, transition of the number of shots on the assumption of single beam writing of the VSB system. In the case of single beam writing, the number of shots in the CPM region 37 (section) of high pattern area density ρ(x, y) is greater than that in the CPM region 37 of low pattern area density ρ(x, y). FIG. 9D shows, for reference, a chart of the stage speed on the assumption of single beam writing of the VSB system. Since the writing time is almost proportional to the number of shots, the number of shots in the CPM region 37 (section) of high pattern area density ρ(x, y) is greater than that in the CPM region 37 (section) of low pattern area density ρ(x, y), and accordingly, the greater is, the more the writing time increases, and therefore, the stage speed becomes slower. Thus, the stage speed is determined based on a pattern density in single beam writing of VSB system.

FIG. 9E shows transition of the writing time of each CPM region 37 (section) by denoting it as the position of the irradiation region 34 (writing field). Moreover, FIG. 9E shows the writing time of the CPM region 37 which partially or totally overlaps with the irradiation region 34 (writing field), by denoting it as the reference position (center, in this example) of the irradiation region 34 (writing field). The writing time of the CPM region 37 (section) of high pattern density is short, and that of the CPM region 37 (section) of low pattern density is long. In other words, transition of the writing time of the irradiation region 34 (writing field) is proportional to transition of the value of the proximity effect correction irradiation coefficient Dp(x, y) shown in FIG. 9A. FIG. 9E preferentially shows the irradiation region 34 (writing field) belonging to the CPM region 37 (section) where writing time is long. Even if the reference position (center) of the irradiation region 34 (writing field) is in the CPM region 37 (section) where writing time is short, when a part of a writing region overlaps with the CPM region 37 (section) where writing time is long, controlling is performed based on the long irradiation time. Therefore, the part where the irradiation region 34 (writing field) belongs to the CPM region 37 (section) of long writing time is shown wider than the CPM region 37 (section) concerned. Since the reference position of the irradiation region 34 (writing field) is its center in this example, the part where the irradiation region 34 belongs to the CPM region 37 of long writing time is shown widely such that the half part of the irradiation region 34 protrudes.

FIG. 9F shows transition of the stage speed. As described above, a plurality of shots during the tracking cycle of the irradiation region 34 (writing field) which overlaps with the CPM region 37 belong to the writing time of the CPM region 37 concerned. Therefore, a plurality of shots during the tracking cycle of the irradiation region 34 (writing field) which overlaps with the CPM region 37 correspond to the stage speed of the CPM region 37 concerned. Consequently, as shown in FIG. 9F, the stage speed changes in the middle of the CPM region 37 (section). In other words, a gap occurs between the speed region of each CPM region 37 (section) and the CPM region 37 (section) concerned. If the irradiation region 34 of low stage speed and the irradiation region 34 of high stage speed overlap with each other, the low speed becomes preferential. This is because if the stage speed is too high, the amount of tracking for correcting the stage movement becomes excessive before the irradiation time is completed, and thus, the irradiation position may deviate from the deflectable region of the deflector 208. The stage speed is accelerated or decelerated so that it may not exceed the speed calculated for the CPM region 37 concerned. Therefore, in the case of accelerating from a low speed to a high speed, the acceleration is performed after entering the high speed region until it comes to the speed of the relevant CPM region 37 of the high speed. In contrast, in the case of decelerating from a high speed to a low speed, the deceleration is performed at the end part of the high speed region such that the deceleration has been completed before entering the low speed region. The speed chart generation unit 80 generates a stage speed chart in accordance with what is described above. The generated stage speed chart data is stored in the storage device 142. If the stage speed is controlled as described above, the stage speed will be slower than an actual writing speed as also shown in the figure. However, when actually performing writing, it is impossible to write beyond the deflectable range (writable range) of an electron optics system. Therefore, a certain control mechanism is needed by which writing is carried out while synchronization between the actual stage position and writing control is performed in order to apply a shot to a predetermined writing position. For example, a predetermined part should not be written until the stage position moves to a specified writing range (for example, tracking feasible range).

In the data transmission processing step (S156), the transmission processing unit 82 outputs shot data for each shot stored in the storage device 142 to the deflection control circuit 130. The deflection control circuit 130 transmits, for each shot, shot data of each shot to the logic circuit 41 for each beam. Moreover, the deflection control circuit 130 generates deflection data for high-speed shift deflection and deflection data for tracking control. Synchronized with the timing of each shot, the deflection control circuit 130 outputs the deflection data for high-speed shift deflection to the DAC amplifier unit 132. The DAC amplifier unit 132 converts deflection data generated by digital signals into analog data to be amplified and applied as a deflection voltage to the deflector 209. Moreover, the deflection control circuit 130 outputs deflection data for tracking control to the DAC amplifier unit 134 in accordance with the timing of tracking operation of the deflection region 34. The DAC amplifier unit 134 converts deflection data generated by digital signals into analog data to be amplified and applied as a deflection voltage to the deflector 208.

In the writing step (S158), under the control of the writing control unit 84, the stage control unit 138 reads the stage speed chart, and variably controls the speed of the XY stage 105 in accordance with the stage speed chart. As shown in the stage speed chart of FIG. 9F, in the case of writing a region on the target object of high pattern density of the writing target pattern, the stage control unit 138 controls the speed of the XY stage 105, on which the target object is placed, at high speed, and in the case of writing a region on the target object of low pattern density, controls the speed of the XY stage 105 at low speed. While synchronized with the movement of the XY stage 105, the writing mechanism 150 writes a pattern on the target object 101 with the multi-beams 20 of an electron beam. Thus, while the stage control unit 138 variably controls the speed of the XY stage 105, the writing mechanism 150 writes a pattern on the target object 101 with the multi-beams 20 of an electron beam. In that case, a plurality of times of shots are performed with multi-beams each having a different maximum irradiation time while the position of each beam is shifted during one tracking cycle in the state where the irradiation region 34 is set on the target object 101 as described above. Then, writing processing of the entire stripe region 32, and furthermore the entire writing region 30 of the target object 101 is performed by repeating the writing of the tracking cycle.

FIGS. 10A and 10B show the relation between shot time shortening and a pattern density according to the first embodiment. The example of FIG. 10A shows the case of uniformly setting the maximum irradiation time (settable maximum irradiation time), such as 1023Δ, for each shot. In each shot at the region of high density (region where pattern density is high), an omissible portion (time) exists in the irradiation time. In contrast, in each shot at the region of low density (region where pattern density is low), an omissible portion (time) does not exist in the irradiation time. Therefore, according to the first embodiment, as shown in FIG. 10B, the omissible portion (time) of each shot at the region of high density (region where pattern density is high) is eliminated. Thereby, the maximum irradiation time for each shot becomes variable, and the writing time of each shot can be greatly reduced. In other words, the writing mechanism 150 performs a plurality of times of shots of the multi-beams 20 such that the switching time period of switching each shot to a next shot is variable according to the maximum irradiation time of each shot of the multi-beams 20. Specifically, the writing mechanism 150 eliminates the time exceeding the maximum irradiation time of each shot in the settable maximum irradiation time which can be set for one-time shot of the multi-beams 20, and then performs a next shot of multi-beams. Since the maximum irradiation time of each shot becomes variable, the stage speed can be variable, such as increasing the speed of the XY stage 105 in the region of high density (region where pattern density is high).

As described above, according to the first embodiment, the throughput performance can be further increased by variably moving the XY stage 105 in multi-beam writing.

If there is a region where no pattern exists in the stripe region 32, the region is set as one CPM region 37. Then, with respect to the CPM region 37 (NULL region) where no pattern exists, the stage should be moved at high speed. Thereby, the throughput performance can be further enhanced.

Second Embodiment

In the first embodiment, there has been described the case where each of multi-beams of one-time shot individually performs continuous irradiation during a required irradiation time. The irradiation method of beams in each shot is not limited thereto. The second embodiment describes a configuration in which one-time shot is divided into a plurality of divided shots and the divided beam irradiates the same position in order.

Figure 11:
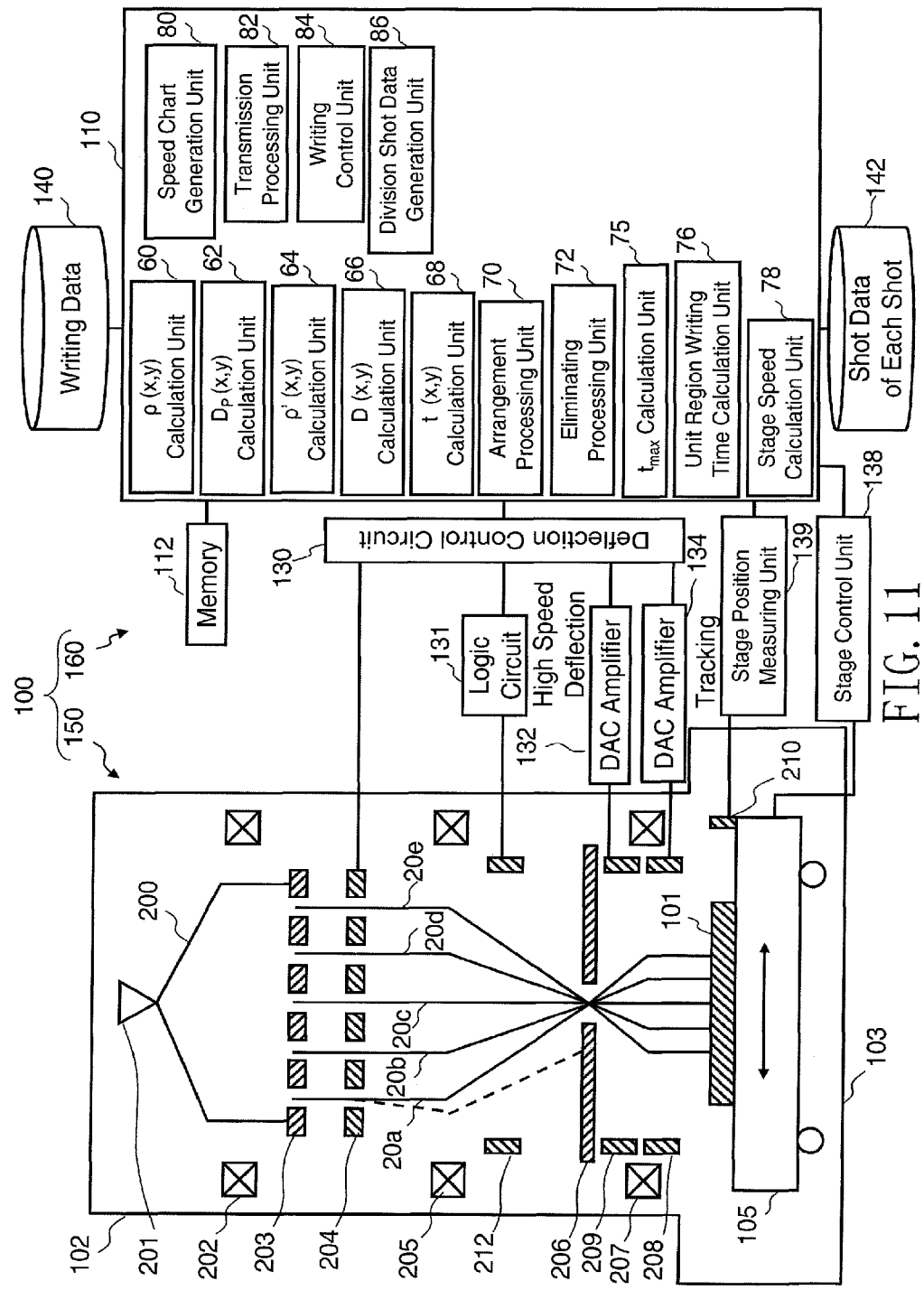
FIG. 11 is a conceptual diagram showing the configuration of a writing apparatus according to a second embodiment.

FIG. 11 is a conceptual diagram showing the configuration of a writing apparatus according to the second embodiment. FIG. 11 is the same as FIG. 1 except that, in the writing apparatus 100, a deflector 212 is arranged between the blanking aperture array mechanism 204 and the limiting aperture substrate 206 in the electron optical column 102, the control unit 160 further includes a logic circuit 131, and, in the control computer 110, a divided shot data generation unit 86, and a maximum irradiation time $t_{max}$ calculation unit 75 instead of the maximum irradiation time $t_{max}$ acquisition unit 74 are arranged. The contents of the present embodiment are the same as those of the first embodiment except what is specifically described below.

The logic circuit 131 is connected to the deflection control circuit 130, and the deflector 212.

Each " . . . unit", such as the pattern area density ρ(x, y) calculation unit 60, the proximity effect correction irradiation coefficient Dp(x, y) calculation unit 62, the pattern area density ρ'(x, y) in pixel calculation unit 64, the dose D(x, y) calculation unit 66, the irradiation time t(x, y) calculation unit 68, the arrangement processing unit 70, the eliminating processing unit 72, the maximum irradiation time $t_{max}$ calculation unit 75, the divided shot data generation unit 86, the unit region writing time calculation unit 76, the stage speed calculation unit 78, the speed chart generation unit 80, the transmission processing unit 82, and the writing control unit 84 includes a processing circuitry. As the processing circuitry, for example, an electric circuit, computer, processor, circuit board, quantum circuit, semiconductor device, or the like can be used. Each " . . . unit" may use a common processing circuitry (same processing circuitry), or different processing circuitries (separate processing circuitries). Data which is input and output to/from the pattern area density ρ(x, y) calculation unit 60, the proximity effect correction irradiation coefficient Dp(x, y) calculation unit 62, the pattern area density ρ'(x, y) in pixel calculation unit 64, the dose D(x, y) calculation unit 66, the irradiation time t(x, y) calculation unit 68, the arrangement processing unit 70, the eliminating processing unit 72, the maximum irradiation time $t_{max}$ calculation unit 75, the divided shot data generation unit 86, the unit region writing time calculation unit 76, the stage speed calculation unit 78, the speed chart generation unit 80, the transmission processing unit 82, and the writing control unit 84, and data being operated are stored in the memory 112 each time.

Figure 12:
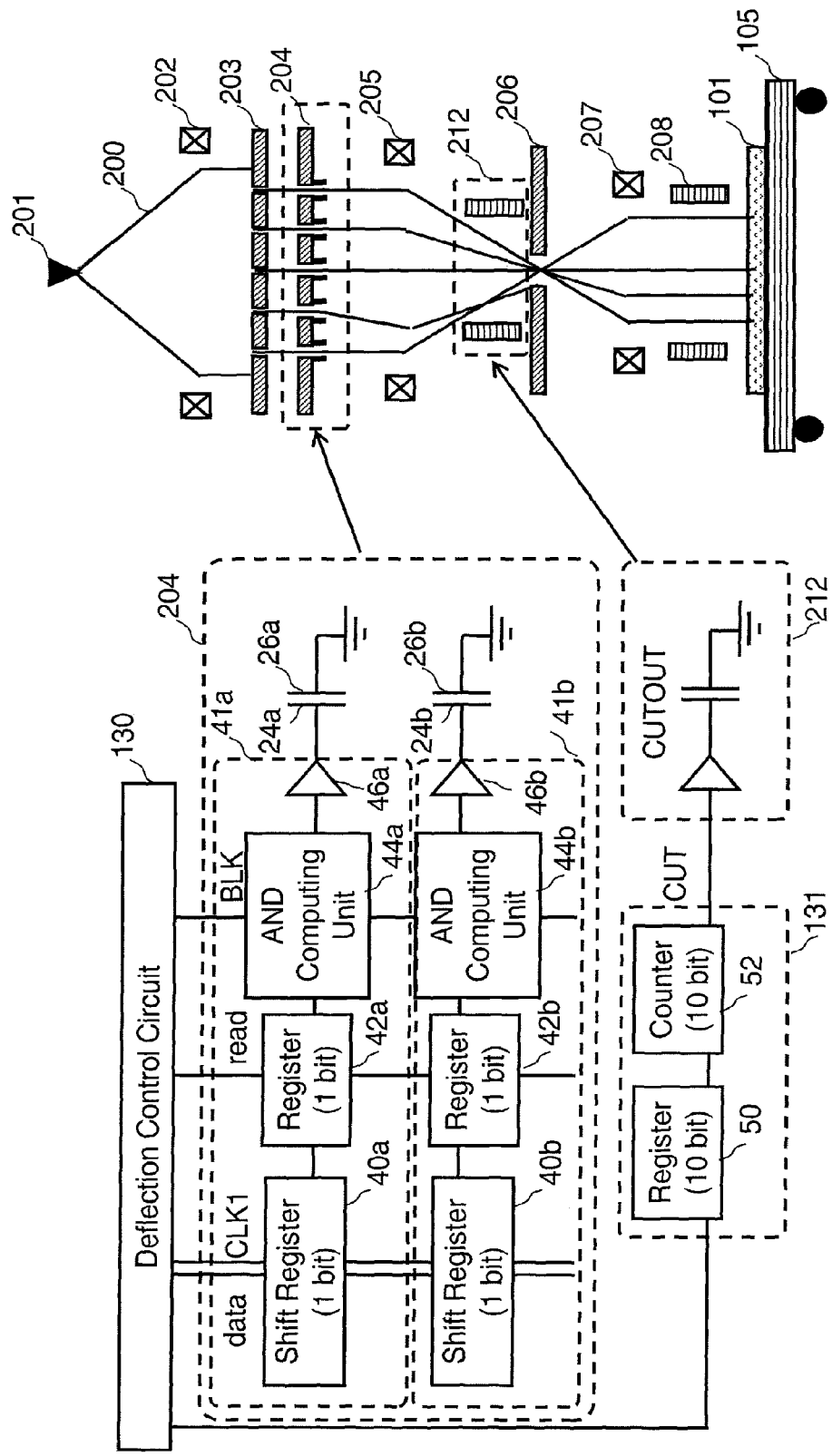
FIG. 12 is a schematic diagram showing the internal configuration of an individual blanking control circuit and a common blanking control circuit according to the second embodiment.

FIG. 12 is a schematic diagram showing the internal configuration of an individual blanking control circuit and a common blanking control circuit according to the second embodiment. As shown in FIG. 12, a shift register 40, a register 42, and an AND computing unit 44 are arranged in each logic circuit 41 for controlling individual blanking arranged in the blanking aperture array mechanism 204 in the body of the writing apparatus 100. The AND computing unit 44 may be omitted. According to the second embodiment, for example, a 1-bit control signal is used for individual blanking control for each beam, which has conventionally been controlled by, for example, a 10-bit control signal. That is, a 1-bit control signal is input/output into/from the shift register 40, register 42, and AND computing unit 44. Since the amount of information of the control signal is small, the installation area of the control circuit can be made small. In other words, even when a logic circuit is arranged on the blanking aperture array mechanism 204 whose installation space is small, more beams can be arranged at a smaller beam pitch. This increases the amount of current passing through the blanking aperture array mechanism 204, and therefore, improves the writing throughput.

Moreover, an amplifier is arranged in the deflector 212 for common blanking, and a register 50 and a counter 52 are arranged in the logic circuit 131. These do not simultaneously perform several different controls, and therefore, it is sufficient to use one circuit to perform on/off control. Accordingly, even when arranging a circuit for a high speed response, no problem occurs with respect to restriction on the installation space and the current to be used in the circuit. Therefore, this amplifier operates at very high speed compared to an amplifier realizable on the blanking aperture. This amplifier is controlled by a 10-bit control signal, for example. That is, for example, a 10-bit control signal is input/output to/from the register 50 and the counter 52.

According to the second embodiment, blanking control of each beam is performed by using both the beam on/off control by each logic circuit 41 for individual blanking control and the beam on/off control by the logic circuit 131 for common blanking control that collectively performs blanking control of the entire multi beams.

Figure 13:
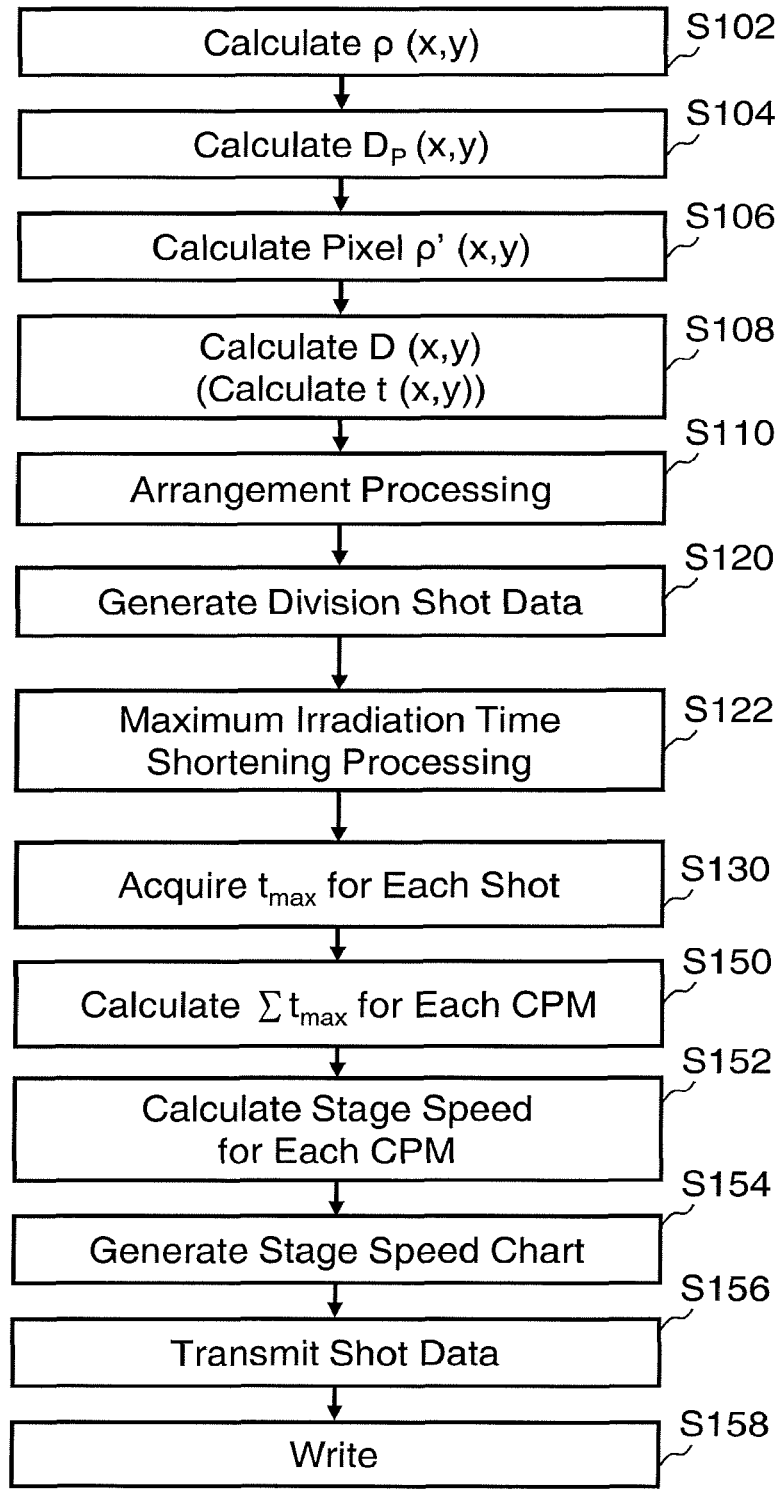
FIG. 13 is a flowchart showing main steps of a writing method according to the second embodiment.

FIG. 13 is a flowchart showing main steps of a writing method according to the second embodiment. In FIG. 13, the writing method according to the second embodiment is the same as that of FIG. 7 except that a divided shot data generation step (S120) is performed between the arrangement processing step (S110) and the maximum irradiation time shortening processing step (S122).

The contents of each step from the pattern area density ρ(x, y) calculation step (S102) to the arrangement processing step (S110) are the same as those in the first embodiment.

In the divided shot data generation step (S120), the divided shot data generation unit 86 generates divided shot data for dividing one-time shot into a plurality of times of divided shots, each having a different irradiation time, to continuously irradiate the same position. The divided shot data generation unit 86 converts, for each shot, a gray scale value N, which is obtained by dividing the irradiation time of each of multi-beams by the quantization unit Δ (gray scale resolution), into a predetermined n-digit binary value. For example, when N=50, since $50=2^5+2^4+2^1$, if converting it into a 10-digit binary value, it becomes "0000110010". For example, if N=500, it is "0111110100". For example, if N=700, it is "1010111100". For example, if N=1023, it is "1111111111". With respect to each shot, the irradiation time of each beam is equivalent to the irradiation time defined for a mesh region to be irradiated by each beam concerned.

Although it is sufficient for n, being the number of digits, to be two or more, preferably it should be four or more digits, and more preferably, it should be eight or more digits. Here, 10-digit is used as an example.

According to the second embodiment, for each shot of beams, irradiation of each beam of each shot of beams concerned is divided into irradiation steps of "n" times, "n" being the number of digits of a binary number sequence (data of binary numbers) set in advance. The irradiation steps of n times is equivalent to a combination of irradiation of irradiation time periods. A maximum irradiation time period per shot of beams of the multiple beams is divided into a plurality, being the digit number "n", of the irradiation time periods. Each of the irradiation time periods is calculated by multiplying a corresponding gray scale value of a plurality of gray scale values by Δ, where the plurality of gray scale values are gray scale values defined in decimal numbers converted from each digit value of a binary value of n-digit. In other words, one shot is divided into a plurality of divided shots each having an irradiation time of $\Delta a_{n-1} 2^{n-1}, \ldots, \Delta a_k 2^k, \ldots, \Delta a_1 2^1, \Delta a_0 2^0$. In the case of n=10, n being the number of digits, one shot is divided into ten-time divided shots (irradiation steps). $a_k$ indicates a bit value of each digit. Therefore, although a divided shot corresponding to a bit value 1 performs beam irradiation, a divided shot corresponding to a bit value 0 does not perform beam irradiation.

FIG. 14 is a bit processing table showing the relation between each digit number and an irradiation time of each digit in the case of the digit number n=10 according to the second embodiment. As shown in FIG. 14, the irradiation time of the first digit (k=0) (first bit) is Δ, the irradiation time of the second digit (k=1) (second bit) is 2Δ, the irradiation time of the third digit (k=2) (third bit) is 4Δ, the irradiation time of the fourth digit (k=3) (fourth bit) is 8Δ, . . . , the irradiation time of the tenth digit (k=9) (tenth bit) is 512Δ.

For example, in the case of n=10, n being the number of digits, if N=700, the irradiation time of the tenth digit (tenth bit) is Δ×512. The irradiation time of the ninth digit (ninth bit) is Δ×0=0. The irradiation time of the eighth digit (eighth bit) is Δ×128. The irradiation time of the seventh digit (seventh bit) is Δ×0=0. The irradiation time of the sixth digit (sixth bit) is Δ×32. The irradiation time of the fifth digit (fifth bit) is Δ×16. The irradiation time of the fourth digit (fourth bit) is Δ×8. The irradiation time of the third digit (third bit) is Δ×4. The irradiation time of the second digit (second bit) is Δ×0=0. The irradiation time of the first digit (first bit) is Δ×0=0. The total time of these is 700Δ. Thus, the divided shot data generation unit 86 generates, for each of multi-beams, divided shot data so that a group of divided shots, by which an irradiation time needed for a pixel (irradiation position) to be irradiated can be obtained, may be selected from a plurality of times of divided shots each having an irradiation time of $\Delta a_{n-1} 2^{n-1}, \ldots, \Delta a_k 2^k, \ldots, \Delta a_1 2^1, \Delta a_0 2^0$. When the irradiation time is zero (N=0), data "0000000000" indicating to select no divided shot should be generated.

For example, in the case of performing irradiation in order from the largest digit, if Δ=1 ns, the first irradiation step is 512 ns (beam on) irradiation. The second irradiation step is 0 ns (beam off) irradiation. The third irradiation step is 128 ns (beam on) irradiation. The fourth irradiation step is 0 ns (beam off) irradiation. The fifth irradiation step is 32 ns (beam on) irradiation. The sixth irradiation step is 16 ns (beam on) irradiation. The seventh irradiation step is 8 ns (beam on) irradiation. The eighth irradiation step is 4 ns (beam on) irradiation. The ninth irradiation step is 0 ns (beam off) irradiation. The tenth irradiation step is 0 ns (beam off) irradiation.

In the maximum irradiation time shortening processing step (S122), the eliminating processing unit 72 performs, for each shot, processing for shortening the maximum irradiation time by eliminating unnecessary latency time.

FIGS. 15A and 15B show examples illustrating processing for shortening a maximum irradiation time according to the second embodiment. In FIGS. 15A and 15B, for example, a divided shot whose irradiation time is less than 32Δ in the ten-time divided shots described above is not illustrated. FIG. 15A shows the case of uniformly performing ten-time divided shots for each shot. In other words, FIG. 15A shows the case of uniformly setting 1023Δ as the maximum irradiation time of each shot. Moreover, the example of FIG. 15A shows whether there is a divided shot or not with respect to each beam (here, beams 1 to 5) of the k-th shot, the (k+m)th shot, and the (k+p)th shot.

With respect to the k-th shot, concerning the beam 1, the divided shot whose irradiation time is 32Δ, 256Δ, or 512Δ is "beam on". However, the divided shot whose irradiation time is 64Δ or 128Δ is "beam off". Therefore, concerning the beam 1, the period of the divided shot whose irradiation time is 64Δ or 128Δ is a latency time. Concerning the beam 2, the divided shot whose irradiation time is 64Δ or 256Δ is "beam on". However, the divided shot whose irradiation time is 32Δ, 128Δ, or 512Δ is "beam off". Therefore, concerning the beam 2, the period of the divided shot whose irradiation time is 32Δ, 128Δ, or 512 Δ is a latency time. Similarly, concerning the beam 3, the period of the divided shot whose irradiation time is 32Δ, 64Δ, 128Δ, or 512Δ is a latency time. Similarly, concerning the beam 4, the period of the divided shot whose irradiation time is 32Δ, 128Δ, or 512Δ is a latency time. Similarly, concerning the beam 5, the period of the divided shot whose irradiation time is 32Δ, 64Δ, 128Δ, or 512Δ is a latency time. Therefore, in the k-th shot, the period of the divided shot whose irradiation time is 128Δ is a latency time without irradiating any beam. Similarly, in the (k+m)th shot, the period of the divided shot whose irradiation time is 512Δ is a latency time without irradiating any beam. On the other hand, in the (k+p)th shot, there is no divided shot period without irradiating any beam, and thus, all the divided shots are required. In other words, the original maximum irradiation time is needed for the shot.

The eliminating processing unit 72 performs, for each shot, processing for eliminating the latency time. In other words, the eliminating processing unit 72 eliminates, for each shot, the period of a divided shot which has not been selected by any beam of the multi-beams 20. In the example of FIG. 15B, with respect to the k-th shot, the period of the divided shot whose irradiation time is 128Δ is a latency time. Therefore, concerning the k-th shot, the latency time can be reduced by eliminating the divided shot whose irradiation time is 128Δ. Consequently, the writing time can be reduced by this latency time with respect to the k-th shot. With respect to the (k+m)th shot, the period of the divided shot whose irradiation time is 512Δ is a latency time. Therefore, concerning the (k+m)th shot, the latency time can be reduced by eliminating the divided shot whose irradiation time is 512Δ. With respect to the (k+p)th shot, since there is no latency time, no reduction can be performed. As described above, processing to shorten the maximum irradiation time is performed for all the shots.

In the maximum irradiation time $t_{max}$ acquisition step (S130) for each shot, the maximum irradiation time $t_{max}$ calculation unit 75 calculates, for each shot, the total of irradiation time of remaining divided shots, as the maximum irradiation time $t_{max}$ of the shot concerned.

The contents of each step from the unit region writing time calculation step (S150) to the stage speed chart generation step (S154) are the same as those of the first embodiment.

In the data transmission processing step (S156), the transmission processing unit 82 outputs, for each shot of each beam, irradiation time array data having been converted into binary data of n digits to the deflection control circuit 130. The deflection control circuit 130 outputs, for each shot, the irradiation time array data to the logic circuit 41 for each beam. Moreover, synchronized with this, the deflection control circuit 130 outputs timing data of each divided shot to the logic circuit 131 for common blanking.

FIG. 16 shows an example of a part of irradiation time array data according to the second embodiment. FIG. 16 shows apart of irradiation time array data of a predetermined shot with respect to beams, such as beams 1 to 5, in the multi-beams. The example of FIG. 16 shows irradiation time array data of from the k-th bit (k-th digit) divided shot irradiation step to the (k−3)th bit ((k−3)th digit) divided shot irradiation step concerning the beams 1 to 5. In the example of FIG. 16, as to the beam 1, data "1101" is shown for the irradiation step of the divided shots from the k-th bit (k-th digit) to the (k−3)th bit ((k−3)th digit). As to the beam 2, data "1100" is shown for the irradiation step of the divided shots from the k-th bit (k-th digit) to the (k−3)th bit ((k−3)th digit). As to the beam 3, data "0110" is shown for the irradiation step of the divided shots from the k-th bit (k-th digit) to the (k−3)th bit ((k−3)th digit). As to the beam 4, data "0111" is shown for the irradiation step of the divided shots from the k-th bit (k-th digit) to the (k−3)th bit ((k−3)th digit). As to the beam 5, data "1011" is shown for the irradiation step of the divided shots from the k-th bit (k-th digit) to the (k−3)th bit ((k−3)th digit).

According to the second embodiment, as shown in FIG. 12, since the shift register 40 is used for the logic circuit 41, the deflection control circuit 130 transmits data of the same bit (the same digit number) to each logic circuit 41 of the blanking aperture array mechanism 204 in the order of beam array (or in the order of identification number). Moreover, a clock signal (CLK1) for synchronization, a read signal (read) for data read-out, and an AND computing unit signal (BLK signal) are output. In the case of FIG. 16, for example, as data of the k-th bit (k-th digit) of the beams 1 to 5, each one bit data of "10011" is transmitted from the posterior beam side. The shift register 40 of each beam transmits data to the next shift register 40 in order from the high-order side, based on a clock signal (CLK1). For example, with respect to the data of the k-th bit (k-th digit) of the beams 1 to 5, based on clock signals of five times, one bit data "1" is stored in the shift register 40 of the beam 1. One bit data "1" is stored in the shift register 40 of the beam 2. One bit data "0" is stored in the shift register 40 of the beam 3. One bit data "0" is stored in the shift register 40 of the beam 4. One bit data "1" is stored in the shift register 40 of the beam 5.

Next, in response to an input of a read signal (read), the register 42 of each beam reads the data of the k-th bit (k-th digit) of each beam from the shift register 40. In the example of FIG. 16, one bit data "1" is stored in the register 42 of the beam 1, as the data of the k-th bit (k-th digit). One bit data "1" is stored in the register 42 of the beam 2, as the data of the k-th bit (k-th digit). One bit data "0" is stored in the register 42 of the beam 3, as the data of the k-th bit (k-th digit). One bit data "0" is stored in the register 42 of the beam 4, as the data of the k-th bit (k-th digit). One bit data "1" is stored in the register 42 of the beam 5, as the data of the k-th bit (k-th digit). When inputting the data of the k-th bit (k-th digit), the individual register 42 of each beam outputs, based on the data, an on/off signal to the AND computing unit 44. If the data of the k-th bit (k-th digit) is "1", an "on" signal is output, and if it is "0", an "off" signal is output. Then, when the BLK signal is an "on" signal and the signal of the register 42 is "on", the AND computing unit 44 outputs an "on" signal to the amplifier 46, and the amplifier 46 applies an "on" voltage to the electrode 24 of the individual blanking deflector. In the case other than the above, the AND computing unit 44 outputs an "off" signal to the amplifier 46, and the amplifier 46 applies an "off" voltage to the electrode 24 of the individual blanking deflector.

While the data of the k-th bit (k-th digit) is being processed, the deflection control circuit 130 transmits the data of the (k−1)th bit ((k−1)th digit) to each logic circuit 41 of the blanking aperture array mechanism 204 in the order of beam array (or in the order of identification number). In the case of FIG. 16, for example, as the data of the (k−1)th bit ((k−1)th digit) of the beams 1 to 5, each one bit data of "01111" is transmitted from the posterior beam side. The shift register 40 of each beam transmits data to the next shift register 40 in order from the high-order side, based on a clock signal (CLK1). For example, with respect to the data of the (k−1)th bit ((k−1)th digit) of the beams 1 to 5, based on clock signals of five times, one bit data "1" is stored in the shift register 40 of the beam 1. One bit data "1" is stored in the shift register 40 of the beam 2. One bit data "1" is stored in the shift register 40 of the beam 3. One bit data "1" is stored in the shift register 40 of the beam 4. One bit data "0" is stored in the shift register 40 of the beam 5. After the irradiation time of the k-th bit has been completed, the deflection control circuit 130 outputs a read signal of the next (k−1)th bit ((k−1)th digit). Based on the read signal of the (k−1)th bit ((k−1)th digit), the register 42 of each beam reads data of the (k−1)th bit ((k−1)th digit) of each beam, from the shift register 40. Similarly, it should go to the data processing of the first bit (the first digit). By controlling the timing of output of the read signal to respond to the irradiation time of each divided shot by the deflection control circuit 130, even when a part of a plurality of divided shots is omitted, it is possible to respond to the irradiation time of each divided shot. Moreover, by not transmitting irradiation time array data to the omitted divided shot, shifting to a next divided shot can be efficiently performed.

The AND computing unit 44 shown in FIG. 12 may be omitted. However, it is effective in that a beam can be controlled to be "off" by the AND computing unit 44 when not being able to obtain a beam off state because of trouble of an element of the logic circuit 41. Although the case of FIG. 12 uses a data transmission channel for one bit where the shift registers are arranged in series, it is also preferable to use a plurality of parallel transmission channels in order to perform controlling by data of two bits or more, which further increases the speed of transmission.

In the writing step (S158), under the control of the writing control unit 84, the stage control unit 138 reads the stage speed chart, and variably controls the speed of the XY stage 105 in accordance with the stage speed chart. As shown in the stage speed chart of FIG. 9F, in the case of writing a region on the target object of high pattern density of the writing target pattern, the stage control unit 138 controls the speed of the XY stage 105, on which the target object is placed, at high speed, and in the case of writing a region on the target object of low pattern density, controls the speed of the XY stage 105 at low speed. While synchronized with the movement of the XY stage 105, the writing mechanism 150 writes a pattern on the target object 101 with the multi-beams 20 of an electron beam by dividing one-time shot into a plurality of divided shots, each having a different irradiation time, to continuously irradiate the same position.

Figure 17:
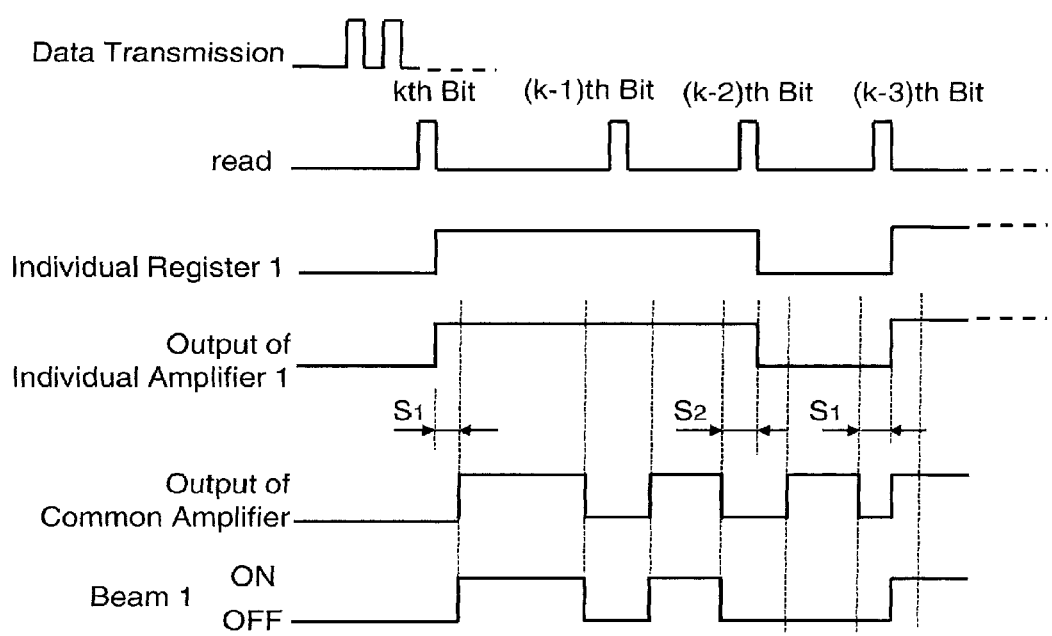
FIG. 17 is a timing chart showing a beam on/off switching operation with respect to a part of an irradiation step during one shot according to the second embodiment.

FIG. 17 is a timing chart showing a beam on/off switching operation with respect to a part of an irradiation step during one shot according to the second embodiment. FIG. 17 shows one beam (beam 1) of a plurality of beams of multi-beams, for example. Here are shown, for example, divided shots from the k-th bit (k-th digit) to the (k−3)th bit ((k−3)th digit) of the beam 1. In the irradiation time array data, for example, the k-th bit (k-th digit) is "1", (k−1)th bit ((k−1)th digit) is "1", (k−2)th bit ((k−2)th digit) is "0", and (k−3)th bit ((k−3)th digit) is "1".

First, responsive to input of a read signal of the k-th bit (k-th digit), the individual register 42 outputs an on/off signal, based on a stored data (1 bit) of the k-th bit (k-th digit).

Since the data of the k-th bit (k-th digit) indicates "on", the individual amplifier 46 (individual amplifier 1) outputs an "on" voltage to be applied to the blanking electrode 24 for the beam 1. On the other hand, the logic circuit 131 for common blanking switches "on" or "off" depending upon timing data of each divided shot used in the shot concerned. The common blanking mechanism outputs an "on" signal during the irradiation time of each divided shot. When a plurality of divided shots of the shot concerned are configured by four-time divided shots, whose respective irradiation time periods are 512Δ, 256Δ, 64Δ, and 32 Δ, for example, if Δ=1 ns, the irradiation time of the first divided shot is 512Δ=512 ns. The irradiation time of the second divided shot is 256Δ=256 ns. The irradiation time of the third divided shot is 64Δ=64 ns. The irradiation time of the fourth divided shot is 32Δ=32 ns. In the logic circuit 131, when timing data of each divided shot is input into the register 50, controlling is performed such that the register 50 outputs data indicating "on" of the k-th digit (k-th bit), the counter 52 counts the irradiation time of the k-th digit (k-th bit), and it becomes "off" after the irradiation time has passed. Concerning omitted divided shots, their timing data is not input, and corresponding irradiation time array data is not transmitted, thereby efficiently reducing the writing time.

Compared with on/off switching of the individual blanking mechanism, the common blanking mechanism performs on/off switching after the voltage stabilization time (settling time) $S_1/S_2$ of the amplifier 46 has passed. In the example of FIG. 17, after the individual amplifier 1 has become "on" and the settling time $S_1$ of the individual amplifier 1 at the time of switching from "off" to "on" has passed, the common amplifier becomes "on". Thereby, beam irradiation at an unstable voltage at the time of rise of the individual amplifier 1 can be avoided. Then, the common amplifier becomes "off" after the irradiation time of the k-th digit (k-th bit) has passed. Consequently, in the case of both the individual amplifier and the common amplifier being "on", an actual beam becomes "on" to irradiate the target object 101. Therefore, it is controlled such that the "on" time period of the common amplifier is the irradiation time of the actual beam. On the other hand, regarding the case of the individual amplifier 1 becoming "off", after the common amplifier becomes "off" and the settling time $S_2$ has passed, the individual amplifier 1 becomes "off". Thereby, beam irradiation at an unstable voltage at the time of fall of the individual amplifier 1 can be avoided.

As described above, in addition to performing on/off switching of each beam by the individual blanking mechanism, by using the common blanking mechanism (logic circuit 131, deflector 212, etc.), beam on/off controlling is collectively performed for the entire multi-beams, and blanking control is performed so that the beam may be in the "on" state only during the irradiation time corresponding to the irradiation step (irradiation) of the k-th bit. Thereby, each shot of the multi-beams is divided into a plurality of times of divided shots, each having a different irradiation time, to continuously irradiate the same position. Then, according to the pattern written on the target object 101, the number of (times of) a plurality of divided shots is variably set. The shorter the total of set irradiation time of divided shots is, the shorter the maximum irradiation time of the shot concerned can be. Since the maximum irradiation time of each shot becomes variable, the stage speed can be variable, such as increasing the speed of the XY stage 105 in the region of high density (region where pattern density is high).

Figure 18:
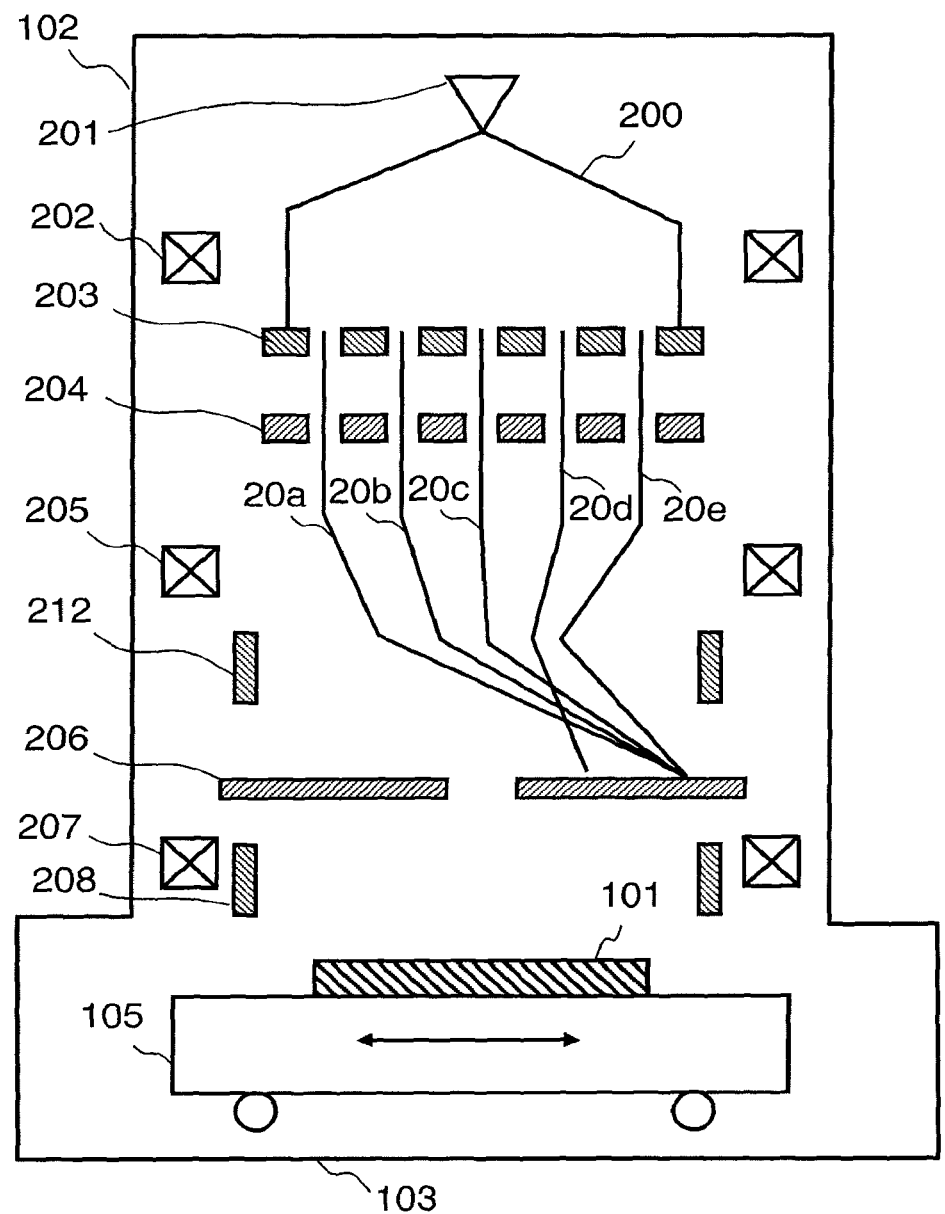
FIG. 18 is a conceptual diagram describing a blanking operation according to the second embodiment.

FIG. 18 is a conceptual diagram describing a blanking operation according to the second embodiment. The multi-beams 20a to 20e having passed through the blanking aperture array mechanism 204 are reduced by the reducing lens 205, and go toward the hole in the center of the limiting aperture substrate 206. At this stage, the electron beam 20 which was deflected by the blanker of the blanking aperture array mechanism 204 deviates from the hole in the center of the limiting aperture substrate 206 (blanking aperture substrate) and is blocked by the limiting aperture substrate 206. On the other hand, the electron beam 20 which was not deflected by the blanker of the blanking aperture array mechanism 204 passes through the hole in the center of the limiting aperture substrate 206, if it is not deflected by the deflector 212 (common blanking mechanism), as shown in FIG. 11. Blanking control is performed by combination of on/off of the individual blanking mechanism and on/off of the common blanking mechanism so as to control on/off of the beam. Thus, the limiting aperture substrate 206 blocks each beam which was deflected to be the "off" state by the individual blanking mechanism or the common blanking mechanism. Then, each beam of a plurality of divided shots obtained by dividing a one-time shot is formed by a beam which has been made during a period from becoming a beam "on" state to becoming a beam "off" state and has passed through the limiting aperture substrate 206. The multi-beams 20 having passed through the limiting aperture substrate 206 are focused by the objective lens 207 so as to be a pattern image of a desired reduction ratio. Respective beams (the whole of the multi-beams 20) having passed through the limiting aperture substrate 206 are collectively deflected in the same direction by the deflector 208 in order to irradiate respective beam irradiation positions on the target object 101. While the XY stage 105 is continuously moving, controlling is performed by the deflector 208 so that the irradiation positions of the beams may follow (track) the movement of the XY stage 105, for example. The multi-beams 20 irradiating at a time are ideally aligned at pitches obtained by multiplying the arrangement pitch of a plurality of holes of the aperture substrate 203 by a desired reduction ratio described above.

As described above, according to the second embodiment, in the multi-beam writing whereby writing is performed by dividing one-time shot into a plurality of divided shots, each having a different irradiation time, to continuously irradiate the same position, the throughput performance can be further increased by variably moving the XY stage 105.

Third Embodiment

According to the second embodiment, each divided shot for obtaining the irradiation time of each beam is selected in order from the divided shot whose irradiation time is defined by the highest order digit in an n-digit binary number, for example. Therefore, for example, when 1023Δ is divided into ten divided shots, if the irradiation time is greater than or equal to 512Δ, a divided shot whose irradiation time is the longest one being 512Δ is certainly included in the ten divided shots. When irradiation of each of multi-beams is divided into a plurality of divided shots, if a divided shot which is not used for irradiation does not exist in any beam for each shot, it does not lead to shortening of the maximum irradiation time. Then, according to the third embodiment, there is described a configuration in which the maximum irradiation time is shortened by using a divided shot whose irradiation time is a specific value being not limited to $2^k \Delta$ and being shorter than $2^{n-1}\Delta$.

Figure 19:
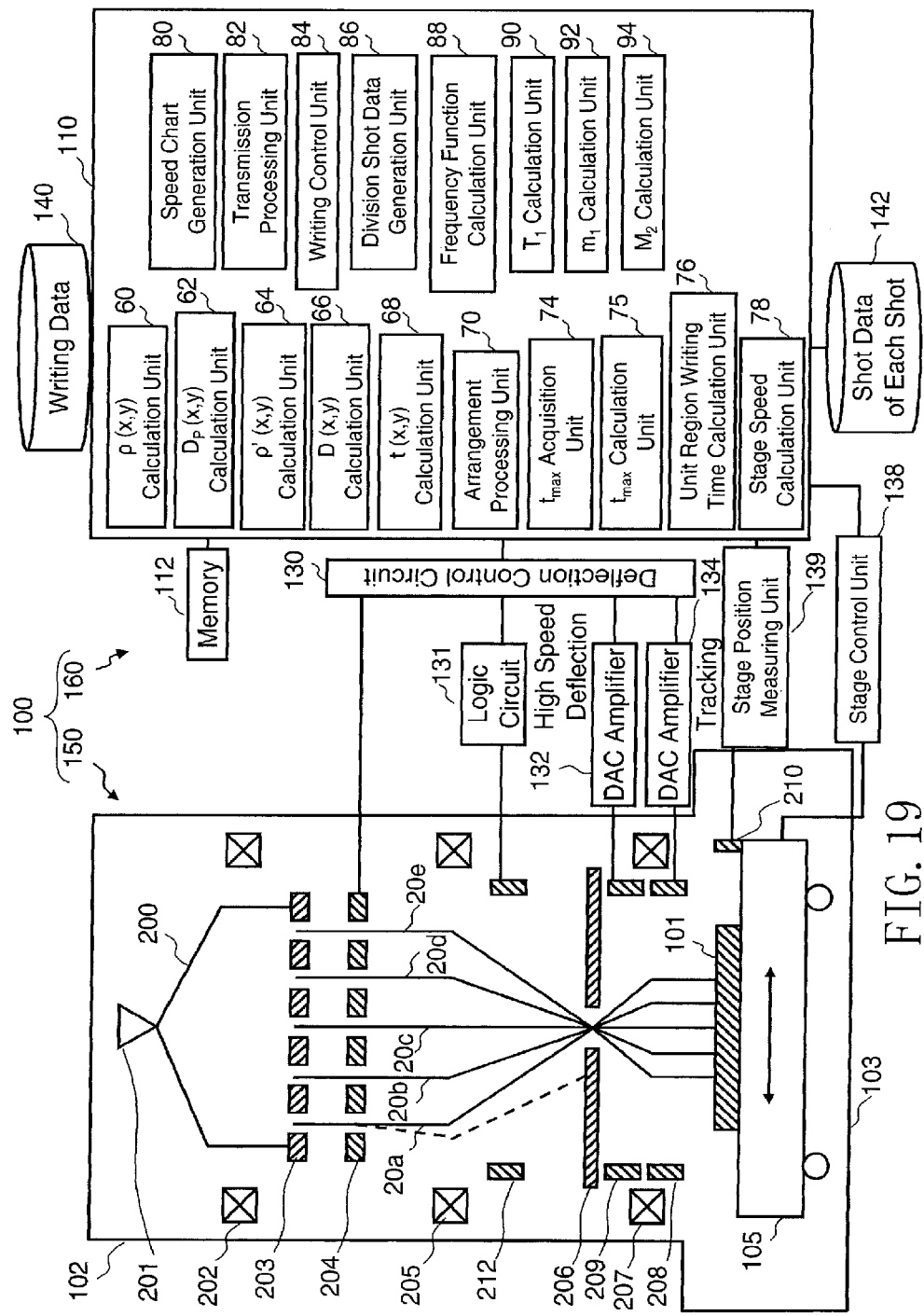
FIG. 19 is a conceptual diagram showing the configuration of a writing apparatus according to a third embodiment.

FIG. 19 is a conceptual diagram showing the configuration of a writing apparatus according to the third embodiment. FIG. 19 is the same as FIG. 11 except that the maximum irradiation time $t_{max}$ acquisition unit 74, a frequency function calculation unit 88, a T1 calculation unit 90, an $m_1$ calculation unit 92, and an $M_2$ calculation unit 94 are added instead of the eliminating processing unit 72 in the control computer 110. The contents of the present embodiment are the same as those of the second embodiment except what is specifically described below.

Each "... unit", such as the pattern area density ρ(x, y) calculation unit 60, the proximity effect correction irradiation coefficient Dp(x, y) calculation unit 62, the pattern area density ρ'(x, y) in pixel calculation unit 64, the dose D(x, y) calculation unit 66, the irradiation time t(x, y) calculation unit 68, the arrangement processing unit 70, the maximum irradiation time $t_{max}$ acquisition unit 74, the frequency function calculation unit 88, the T1 calculation unit 90, the $m_1$ calculation unit 92, the $M_2$ calculation unit 94, the divided shot data generation unit 86, the maximum irradiation time $t_{max}$ calculation unit 75, the unit region writing time calculation unit 76, the stage speed calculation unit 78, the speed chart generation unit 80, the transmission processing unit 82, and the writing control unit 84 includes a processing circuitry. As the processing circuitry, for example, an electric circuit, computer, processor, circuit board, quantum circuit, semiconductor device, or the like can be used. Each "... unit" may use a common processing circuitry (same processing circuitry), or different processing circuitries (separate processing circuitries). Data which is input and output to/from the pattern area density ρ(x, y) calculation unit 60, the proximity effect correction irradiation coefficient Dp(x, y) calculation unit 62, the pattern area density ρ'(x, y) in pixel calculation unit 64, the dose D(x, y) calculation unit 66, the irradiation time t(x, y) calculation unit 68, the arrangement processing unit 70, the maximum irradiation time $t_{max}$ acquisition unit 74, the frequency function calculation unit 88, the T1 calculation unit 90, the $m_1$ calculation unit 92, the $M_2$ calculation unit 94, the divided shot data generation unit 86, the maximum irradiation time $t_{max}$ calculation unit 75, the unit region writing time calculation unit 76, the stage speed calculation unit 78, the speed chart generation unit 80, the transmission processing unit 82, and the writing control unit 84, and data being operated are stored in the memory 112 each time.

Figure 20:
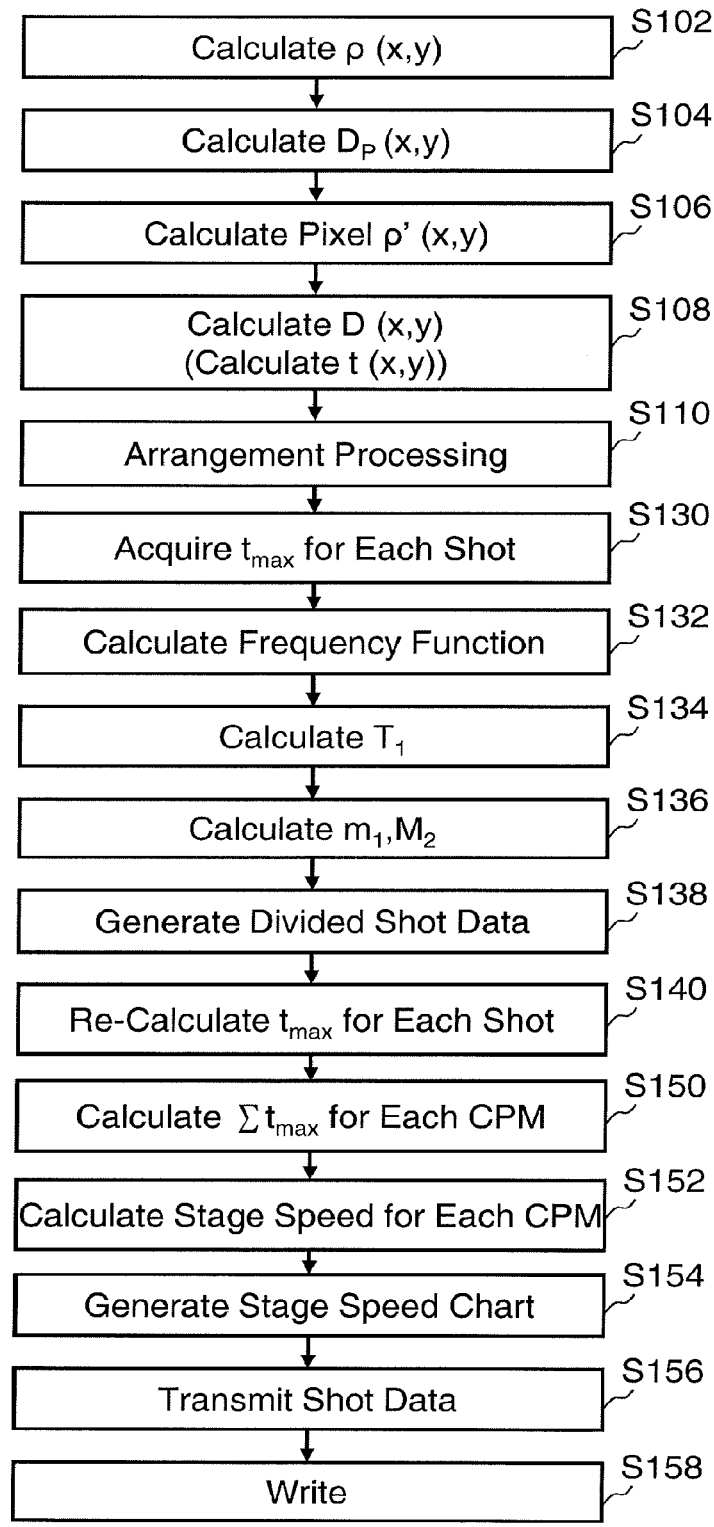
FIG. 20 is a flowchart showing main steps of a writing method according to the third embodiment.

FIG. 20 is a flowchart showing main steps of a writing method according to the third embodiment. In FIG. 20, the writing method according to the third embodiment is the same as that of FIG. 7 except that a frequency function calculation step (S132), a T1 calculation step (S134), an $m_1$ and $M_2$ calculation step (S136), a divided shot data generation step (S138), and a maximum irradiation time $t_{max}$ re-calculation step (S140) are executed between the maximum irradiation time $t_{max}$ acquisition step (S130) for each shot and the unit region writing time calculation step (S150), and the maximum irradiation time shortening processing step (S122) is deleted.

The contents of each step from the pattern area density ρ(x, y) calculation step (S102) to the maximum irradiation time $t_{max}$ acquisition step (S130) for each shot are the same as those in the first embodiment.

In the frequency function calculation step (S132), the frequency function calculation unit 88 calculates a frequency function F(t) depending on the irradiation time t, which defines frequency of the maximum irradiation time $t_{max}$ of each of all the shots for writing the target object 101. In other words, the frequency function F(t) is calculated for each writing layout. Alternatively, the frequency function calculation unit 88 may calculate, for each stripe region or each CPM region 37, a frequency function F(t) depending on the irradiation time t, which defines frequency of the maximum irradiation time $t_{max}$ of each of all the shots for writing the region concerned. When calculating the frequency function F(t) for each CPM region 37, the way of determining the irradiation regions 34 belonging to each CPM region 37 may be the same as that of the first embodiment. Therefore, a plurality of shots performed during a tracking cycle in each of a plurality of irradiation regions 34 belonging to each CPM region 37 correspond to a plurality of times of the shots performed in the CPM region 37 concerned.

Figure 21:
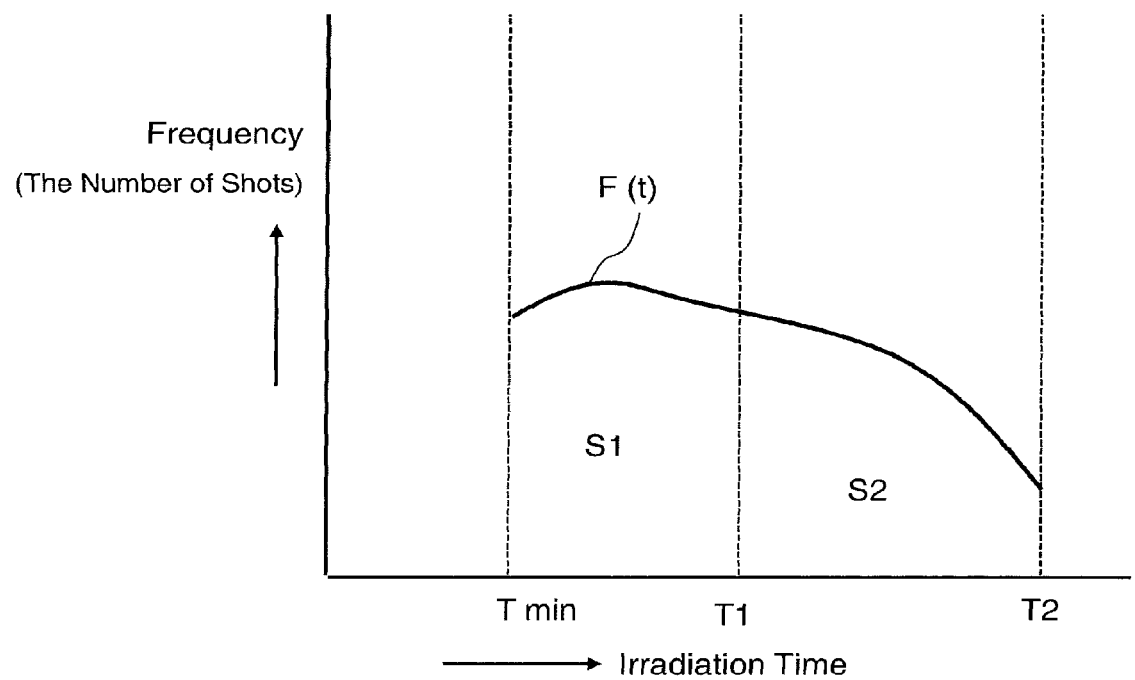
FIG. 21 shows an example of a frequency function graph according to the third embodiment.

FIG. 21 shows an example of a frequency function graph according to the third embodiment. The ordinate axis represents frequency (the number of shots each having the same maximum irradiation time). The abscissa axis represents an irradiation time. There are the minimum maximum irradiation time $T_{min}$ and the largest maximum irradiation time T2, and a plurality of shots each having the same maximum irradiation time are distributed between $T_{min}$ and T2. Here, a shot without any actual irradiation is not included.

In the T1 calculation step (S134), the T1 calculation unit 90 calculates an irradiation time T1, between $T_{min}$ and T2, satisfying the conditions described below. The T1 calculation unit 90 defines an integral value (area) S1 (=ΣF(t), $T_{min} \leq t \leq T1$) of frequency function F(t) from $T_{min}$ to T1, and an integral value (area) S2 ($=\Sigma F(t)$, $T1 < t \leq T2$) of frequency function F(t) from T1 to T2. Here, the integral value (area) indicates the number of shots in each range. The writing time Tc on the control sequence of multi-beams can be defined by the following equation (1). The equation (1) represents the case of disregarding the latency time caused by the stage movement. To remove the time of a divided shot without any actual irradiation, which has been described in the second embodiment, is not herein described in the figures and equations. If this removing the time of a divided shot without any actual irradiation is concomitantly used, the time can be further reduced by the removal.

$$Tc = S1 \cdot T1 + S2 \cdot T2 \quad (1)$$

This shows the writing time in the case where shots included in S1 are written using the maximum irradiation time T1 and shots included in S2 are written using the maximum irradiation time T2 because divided shots of a specific value (T2−T1) are efficiently omitted.

In the case of performing writing by using the maximum irradiation time of each shot without using the specific value according to the third embodiment, since all the shots are written using the maximum irradiation time T2, the writing time Tc on the control sequence of multi-beams can be defined by the following equation (2).

$$Tc = (S1 + S2) \cdot T2 \quad (2)$$

According to the third embodiment, the T1 calculation unit 90 calculates an irradiation time T1 which minimizes the writing time Tc shown in the equation (1).

Figure 22:
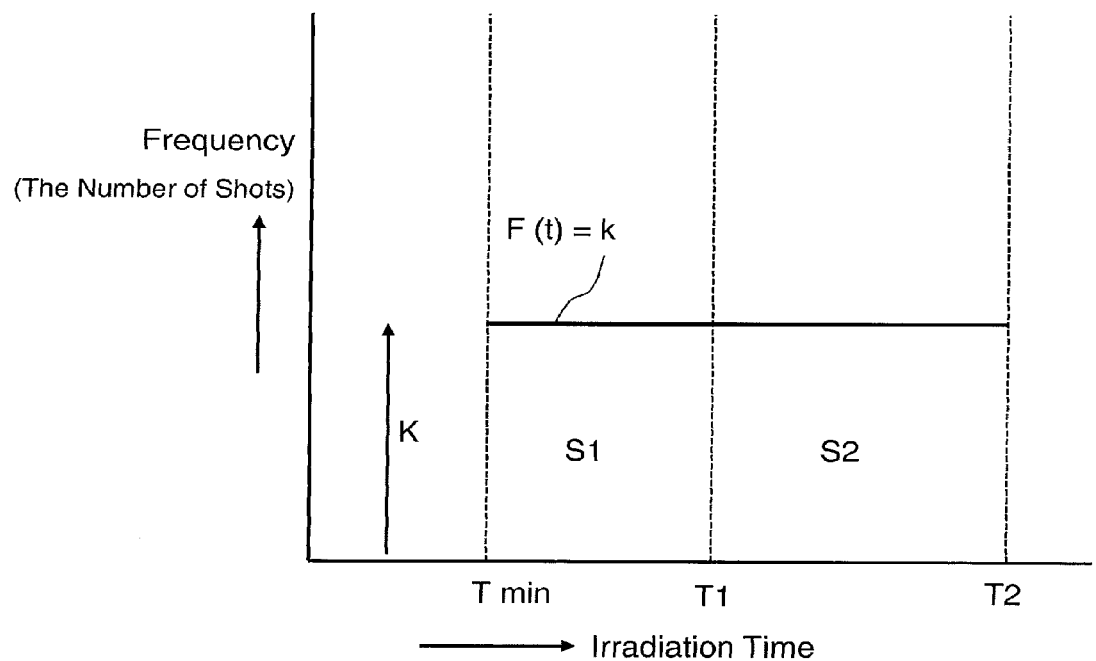
FIG. 22 shows another example of the frequency function graph according to the third embodiment.

FIG. 22 shows another example of the frequency function graph according to the third embodiment. The ordinate axis represents frequency (the number of shots each having the same maximum irradiation time). The abscissa axis represents an irradiation time. FIG. 22 shows the case of assuming a fixed frequency function F(t)=k as a simpler example. In such a case, the equation (1) can be converted to the following equation (3).

$$Tc = S1 \cdot T1 + S2 \cdot T2 \quad (3)$$
$$= k(T1 - T_{min}) \cdot T1 + k(T2 - T1) \cdot T2$$
$$= k\{T1^2 - (T_{min} + T2) \cdot T1 + T2^2\}$$

Assuming that, for example, the proximity effect correction coefficient (backscatter coefficient) is η=0.6 and the irradiation time (dose) of pattern area density 100% is 1.0, the irradiation time (dose) of pattern area density 50% corresponds to 1.23 (relative value) and the irradiation time (dose) of pattern area density 0% (close to 0% but not 0%) corresponds to 1.6 (relative value) in order to stabilize the exposure amount including exposure by a backscattered electron. Therefore, when $T_{min}=1.0$ and T2=1.6 are substituted in the equation (3), the equation (3) can be converted into the following equation (4).

$$Tc = k(T1^2 - 2.6 \cdot T1 + 2.56) \quad (4)$$

Therefore, when the minimum value of the writing time Tc is calculated by differentiating the equation (4) with respect to the time t and assuming that the differential value is 0, the irradiation time T1 becomes 1.3 (T1=1.3). Thus, in this example, if the specific value (T2−T1) of a divided shot is set to be 0.3 (relative value), the writing time can be the minimum.

(Case 1)

For example, in the layout where the region of pattern area density 50% is 95% and the region of pattern area density 0% (close to 0% but not 0%) is 5% in the writing region, the writing time can be obtained as described below. In such a case, the value of T1 which minimizes the writing time is set to include 1.23 (relative value) of the irradiation time (dose) for the region of pattern area density 50%, for example T1=1.25 (relative value).

(1-1): Not Using Specific Value of Third Embodiment $$Tc = (0.95 + 0.05) \times 1.6 = 1.6 \text{(relative value)}$$

(1-2): Shot Division Using Specific Value of Third Embodiment $$Tc = 0.95 \times 1.25 + 0.05 \times 1.6 = 1.27 \text{(relative value)}$$

Therefore, 1.27/1.6=0.79, and thus, when performing shot division by using the specific value according to the third embodiment, the writing time can be shortened to be 0.79 times. Accordingly, when it is possible to appropriately variably control the stage speed, about 20% speed enhancement can be attained.

(Case 2)

For example, in the layout where the region of pattern area density 100% is 95% and the region of pattern area density 0% (close to 0% but not 0%) is 5% in the writing region, the writing time can be obtained as described below. In such a case, the value of T1 which minimizes the writing time is set to include 1.0 (relative value) of the irradiation time (dose) for the region of pattern area density 100%, for example T1=1.05 (relative value).

(2-1) Case not Using Specific Value of the Third Embodiment $$Tc = (0.95 + 0.05) \times 1.6 = 1.6 \text{(relative value)}$$

(2-2) Case Dividing Shot by Using Specific Value of the Third Embodiment $$Tc = 0.95 \times 1.05 + 0.05 \times 1.6 = 1.08 \text{(relative value)}$$

Therefore, 1.08/1.6=0.68, and thus, when performing shot division by using the specific value according to the third embodiment, the writing time can be shortened to be 0.68 times. Accordingly, when it is possible to appropriately variably control the stage speed, about 30% speed enhancement can be attained.

In the m1 and $M_2$ calculation step (S136), the $M_2$ calculation unit 94 calculates a gray scale value $M_2$ of a specific value $M_2\Delta$ (first specific value). The specific value $M_2\Delta$ is defined by T2−T1. The gray scale value $M_2$ of the specific value $M_2\Delta$ is defined by the following equation (5). Here, the remainder δ2 generated by the calculation may be disregarded because errors which occur in the case of the gray scale being 100 or more are substantially small. When it is difficult to tolerate errors in the case of the gray scale being below 100, the remainder δ2 should be suitably rounded up or rounded down so that the shortening effect of the writing time may be acquired.

$$M_2 = (T2 - T1)/\Delta \quad (5)$$

Next, the $m_1$ calculation unit 92 calculates a gray scale value $m_1$ of a specific value $m_1\Delta$ (second specific value) by using a gray scale value $M_1$ ($=T1/\Delta$) of the irradiation time T1. The gray scale value $m_1$ of the specific value $m_1\Delta$ is defined by the following equation (6-1). The digit number n of a binary number should be the maximum number satisfying the following equation (6-2).

$$m_1 = M_1 - (2^n - 1) \quad (6-1)$$

$M_1 \geq 2^n - 1$ (6-2)

By what has been described above, an irradiation time sequence ($M_2\Delta$, $m_1\Delta$, $2^{n-1}\Delta$, $2^{n-2}\Delta$, . . . , $2^0\Delta$) for dividing a shot into a plurality of divided shots can be acquired. Specifically, each shot whose irradiation time is from T1 to T2 is divided into (n+2)-time divided shots whose respective irradiation time are ($M_2\Delta$, $m_1\Delta$, $2^{n-1}\Delta$, $2^{n-2}\Delta$, . . . , $2^0\Delta$), and each shot whose irradiation time is from $T_{min}$ to T1 is divided into (n+1)-time divided shots whose irradiation time are ($m_1\Delta$, $2^{n-1}\Delta$, $2^{n-2}\Delta$, . . . , $2^0\Delta$).

Therefore, it is possible to divide each shot into divided shots using a divided shot whose irradiation time is $M_2\Delta$ being below 512$\Delta$, instead of a divided shot whose irradiation time is 512$\Delta$ defined by the largest digit in the case of defining the conventional maximum irradiation time 1023$\Delta$ (n=10) in binary numbers. Therefore, shortening of the writing time can be achieved by setting an arbitrary maximum irradiation time which is not limited to power of 2. Furthermore, it is possible to change the number of shots depending on whether the maximum irradiation time of each shot is greater than or equal to $M_1\Delta$ or not.

In the divided shot data generation step (S138), the divided shot data generation unit 86 generates divided shot data for dividing one-time shot into a plurality of times of divided shots, each having a different irradiation time, to continuously irradiate the same position. The divided shot data generation unit 86 converts, for each shot, the gray scale value N, which is obtained by dividing the irradiation time of each of multi-beams by the quantization unit $\Delta$ (gray scale resolution), into a combination of preset irradiation time sequence ($M_2$, $m_1$, $2^{n-1}$, $2^{n-2}$, . . . , $2^0$). Specifically, the converting is performed as described below.

When the gray scale value Ts of the irradiation time of a target beam is Ts>M1, the gray scale value Ts1 (=Ts−$M_2$) of the remaining irradiation time is assigned to a remaining irradiation time sequence of the preset irradiation time sequence on the basis of bit($M_2$)=1. When Ts1>$2^n$−1, the gray scale value Ts2 (=Ts1−$m_1$) of the remaining irradiation time is assigned to a remaining irradiation time sequence of the preset irradiation time sequence on the basis of bit($m_1$) =1. When Ts1≤$2^n$−1, the gray scale value Ts2 (=Ts1) of the remaining irradiation time is assigned to a remaining irradiation time sequence of the preset irradiation time sequence on the basis of bit($m_1$)=0. Since the gray scale value Ts2 of the remaining irradiation time is Ts2≤$2^n$−1, it is converted into a combination of gray scale values of the irradiation time using at least one of ($2^{n-1}$, $2^{n-2}$, . . . , $2^0$). Therefore, when Ts>$M_1$, it is converted into (n+2)-time divided shots whose irradiation time are ($M_2\Delta$, $m_1\Delta$, $2^{n-1}\Delta$, $2^{n-2}\Delta$, . . . , $2^0\Delta$).

On the other hand, when the gray scale value Ts of the irradiation time of a target beam is Ts1≤$M_1$, the gray scale value Ts1 (=Ts) of the remaining irradiation time is assigned to a remaining irradiation time sequence of the preset irradiation time sequence on the basis of bit($M_2$)=0. When Ts1>$2^n$−1, the gray scale value Ts2 (=Ts1−$m_1$) of the remaining irradiation time is assigned to a remaining irradiation time sequence of the preset irradiation time sequence on the basis of bit($m_1$)=1. When Ts1≤$2^n$−1, the gray scale value Ts2 (=Ts1) of the remaining irradiation time is assigned to a remaining irradiation time sequence of the preset irradiation time sequence on the basis of bit($m_1$)=0. Since the gray scale value Ts2 of the remaining irradiation time is Ts2≤$2^n$−1, it is converted into a combination of gray scale values of the irradiation time using at least one of ($2^{n-1}$, $2^{n-2}$, . . . , $2^0$). Therefore, when Ts≤$M_1$, it is converted into (n+1)-time divided shots whose irradiation time are ($m_1\Delta$, $2^{n-1}\Delta$, $2^{n-2}\Delta$, . . . , $2^0\Delta$).

As to the writing layout concerned (defined by writing data), calculation is performed for the case, for example, of T2=850$\Delta$ and T1=700$\Delta$, which results in $M_2$=150 and $M_1$=700. Thereby, the maximum number n satisfying $M_1 \geq 2^n - 1$ is nine (n=9). Therefore, $m_1$=189 (=700−511). Thus, the gray scale value sequence of the irradiation time of a plurality of divided shots is (150, 189, $2^8$, $2^7$, . . . , $2^0$).

Now, the case of dividing the gray scale value Ts=850 of the irradiation time of a beam corresponding to the maximum irradiation time of a certain shot into a plurality of times of divided shots is calculated. Since Ts>$M_1$, thus, bit($M_2$=150)=1. Since Ts1>$2^n$−1 (=511) with respect to the remaining Ts1 (=700), thus, bit ($m_1$=189)=1. Therefore, the remaining Ts1 (=511) is Ts1=$2^8$+$2^7$+$2^6$±$2^5$+$2^4$+$2^3$+$2^2$+$2^1$+$2^0$. Accordingly, this beam is converted into eleven-time divided shots, and the divided shot data is (11111111111). Although the number of (times of) divided shots is greater than ten times which is the number of times in the case of converting the maximum irradiation time 1023$\Delta$ into binary numbers, for example, the total irradiation time of divided shots can be lower than 1023$\Delta$.

Next, the case of dividing the gray scale value Ts=700 of the irradiation time of a beam corresponding to the maximum irradiation time of a certain shot into a plurality of times of divided shots is calculated. Since Ts≤$M_1$, thus, bit($M_2$=150)=0. Since Ts1>$2^n$−1 (=511) with respect to the remaining Ts1 (=700), thus, bit(m1=189)=1. Therefore, the remaining Ts1 (=511) is Ts1=$2^8$+$2^7$+$2^6$+$2^5$+$2^4$+$2^3$$2^2$+$2^1$+$2^0$. Accordingly, this beam is converted into ten-time divided shots, and the divided shot data is (1111111111). Therefore, it is possible to omit one-time divided shot. In order to indicate that the divided shot of the specific value $M_2\Delta$, is unnecessary, the divided shot data is preferably defined by eleven digits of (01111111111). Although the number of (times of) divided shots is equal to ten times which is the number of times in the case of converting the maximum irradiation time 1023$\Delta$ into binary numbers, for example, the total irradiation time of divided shots can be lower than 1023$\Delta$. Moreover, when the gray scale value Ts is smaller than 700, the divided shot data is suitably expressed in combination of 1 and 0 so that the specified gray scale value can be obtained.

In order to indicate that divided shots of the specific values $M_2\Delta$ and $m_1\Delta$ are unnecessary, the divided shot data is preferably defined by eleven digits of (00111111111). The number of (times of) divided shots can be less than ten times which is the number of times in the case of converting the maximum irradiation time 1023$\Delta$ into binary numbers, for example, and the total irradiation time of divided shots can be substantially less than 1023$\Delta$. Moreover, it is also effective to set a plurality of specific values for divided shots. For example, in the case in which the maximum irradiation time unevenly exists in three irradiation time sections, if T3 is further added to $T_{min}$, T1, and T2, and writing is performed based on each maximum irradiation time of T1, T2, and T3, shortening of the writing time can be achieved. When the number of the specific values is increased, it becomes possible to perform finer setting so as to attain the shortening effect of the writing time. However, in contrast, processing becomes complicated, and the overhead for switching increases due to increase in the number of divided shots, thereby resulting in increase of the writing time. Therefore, the number of specific values for divided shots should be determined in view of efficiency.

Figures 23A, 23B, 23C:
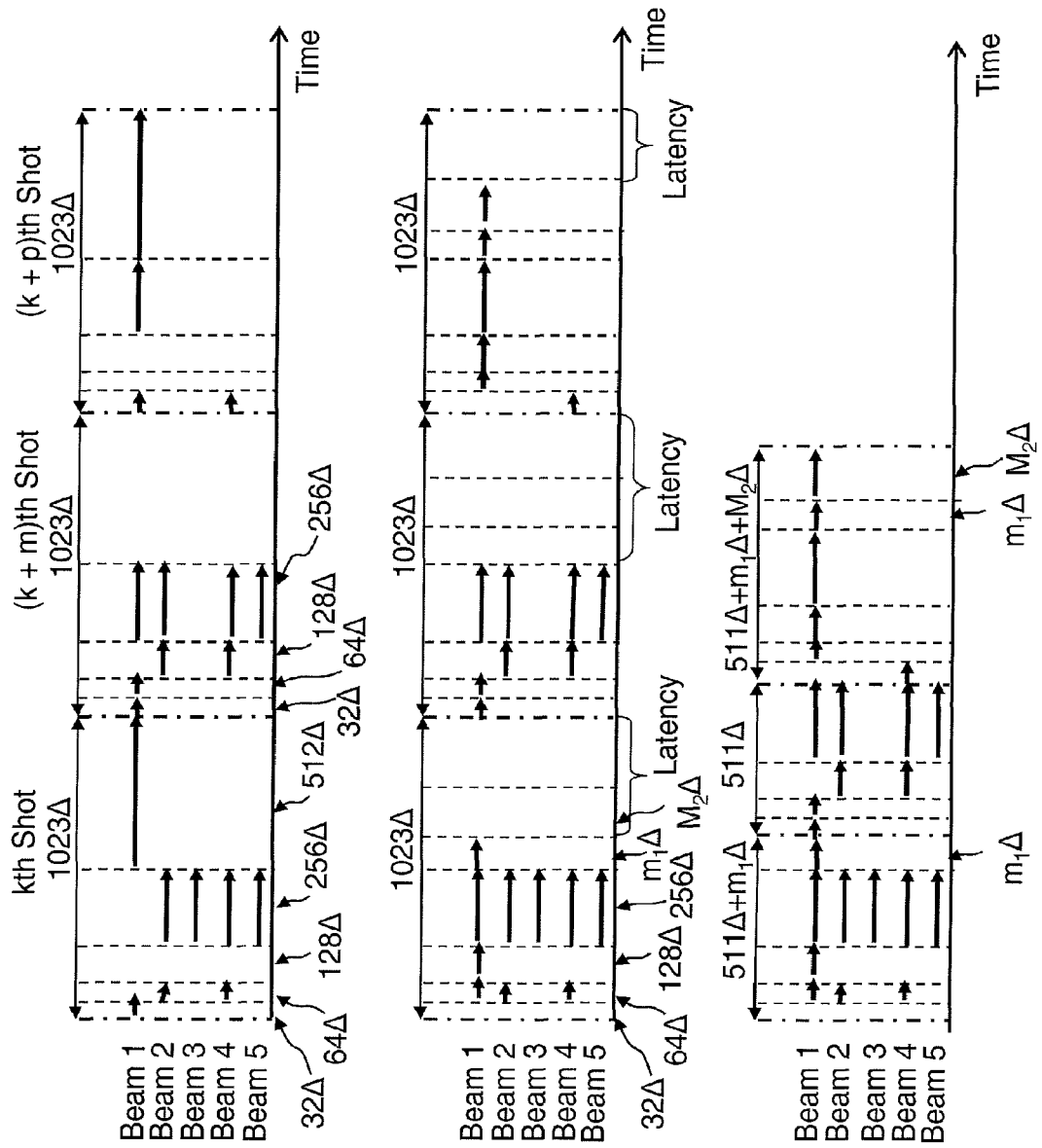
FIGS. 23A to 23C show examples illustrating processing for shortening a maximum irradiation time according to the third embodiment.

FIGS. 23A to 23C show examples illustrating processing for shortening a maximum irradiation time according to the third embodiment. In FIGS. 23A to 23C, a divided shot whose irradiation time is less than 32Δ in a plurality of divided shots described above is not illustrated. FIG. 23A shows the case of uniformly performing ten-time divided shots while setting the maximum irradiation time as 1023Δ for each shot. The example of FIG. 23A shows whether there is a divided shot or not with respect to each beam (here, beams 1 to 5) of the k-th shot, the (k+m)th shot, and the (k+p)th shot.

In FIG. 23A, with respect to the k-th shot, concerning the beam 1, the divided shot whose irradiation time is 512Δ or 32Δ is "beam on". However, the divided shot whose irradiation time is 256Δ, 128Δ, or 64Δ is "beam off". Concerning the beams 2 and 4, the divided shot whose irradiation time is 256Δ or 64Δ is "beam on". However, the divided shot whose irradiation time of 512Δ, 128Δ, or 32Δ is "beam off". Concerning the beams 3 and 5, the divided shot whose irradiation time is 256Δ is "beam on". However, the divided shot whose irradiation time is 512Δ, 128Δ, 64Δ, or 32Δ is "beam off". In FIG. 23A, with respect to the (k+m)th shot, concerning each of the beams 1 to 5, the divided shot whose irradiation time is 512Δ is "beam off". In FIG. 23A, with respect to the (k+p)th shot, concerning the beam 1, the divided shot whose irradiation time is 512Δ, 256Δ, or 32Δ is "beam on". However, the divided shot whose irradiation time is 128Δ or 64Δ is "beam off". Concerning the beams 2, 3, and 5, the irradiation time is 0. Concerning the beam 4, the divided shot whose irradiation time is 32Δ is "beam on". However, the divided shot whose irradiation time is 512Δ, 256Δ, 128Δ, or 64Δ is "beam off".

On the other hand, according to the third embodiment, the specific values $M_2\Delta$ and $m_1\Delta$ are used instead of 512Δ. When assuming proximity effect correction writing, it is usually possible to make $M_2\Delta+m_1\Delta$ shorter than the irradiation time (here, 512Δ) of the largest digit of binary numbers shown in FIG. 23A. Consequently, in FIG. 23B, with respect to the k-th shot, the irradiation time of the beam 1, which is longer than 511Δ, can be replaced with a combination of the divided shots whose irradiation time is $m_1\Delta$, 256Δ, 128Δ, or 64Δ. Since the irradiation time of each of the beams 2 to 5 is less than or equal to 511Δ which is the total from $2^8\Delta$ to $2^0\Delta$, the way of assigning divided shots is the same as that of FIG. 23A. Consequently, since the portion exceeding 511Δ+$m_1\Delta$ serves as a latency time, shortening can be achieved as shown in FIG. 23C. In FIG. 23B, with respect to the (k+m)th shot, since the irradiation time of each of the beams 1 to 5 is less than or equal to 511Δ which is the total from $2^8\Delta$ to $2^0\Delta$, the way of assigning divided shots is the same as that of FIG. 23A. Consequently, since the portion exceeding 511Δ serves as a latency time, shortening can be achieved as shown in FIG. 23C. In FIG. 235, with respect to the (k+p)th shot, the irradiation time of the beam 1, which is longer than 511Δ, can be replaced with a combination of the divided shots whose irradiation time is $M_2\Delta$, $m_1\Delta$, 256Δ, 128Δ, or 64Δ. Since the irradiation time of each of the beams 2 to 5 is less than or equal to 511Δ which is the total from $2^8\Delta$ to $2^0\Delta$, the way of assigning divided shots is the same as that of FIG. 23A. Consequently, since the portion exceeding 511Δ+$M_2\Delta$+$m_1\Delta$ serves as a latency time, shortening can be achieved as shown in FIG. 23C. Although it is not described herein, if the method of removing the time of a divided shot without any actual irradiation is concomitantly used, the irradiation time can be further shortened.

In the maximum irradiation time $t_{max}$ re-calculation step (S140), the maximum irradiation time $t_{max}$ calculation unit 75 calculates, for each shot, the total of shortened irradiation time of divided shots, as the maximum irradiation time $t_{max}$ of the shot concerned.

Each contents from the unit region writing time calculation step (S150) to the writing step (S158) are the same as those in the second embodiment.

As described above, according to the third embodiment, it is possible, using the specific values $M_2\Delta$ and $m_1\Delta$, to further shorten the irradiation time by dividing one-time shot into a plurality of times of divided shots each having a different irradiation time to continuously irradiate the same position, compared to the case of converting the one-time shot into all binary numbers. It is also possible, using the specific values $M_2\Delta$ and $m_1\Delta$, to effectively shorten the irradiation time in "variable dose writing" such as proximity effect correction. Moreover, it is possible, using the specific values $M_2\Delta$ and $m_1\Delta$, to further enhance the throughput performance by variably moving the XY stage 105 in multi-beam writing performed based on a plurality of times of divided shots each having a different irradiation time to continuously irradiate the same position. As to a specific value of a divided shot, it is preferable to set the specific value based on estimation of change of irradiation time which may occur due to beam current fluctuation. A more simplified method for determining the specific value of a divided shot is, for example, to use a specific fixed value (for example, T1=1.3) as in the above example assuming a fixed frequency function F(t)=k for all the writing patterns, by which a sufficient writing time reduction effect can be acquired, though not optimal. Moreover, it is also effective to determine an optimum value as the specific value of a divided shot, for each layout or each type based on a typical pattern, or to determine it experientially. Although the specific value of a divided shot can be determined by various methods, procedures to acquire a more exact optimum value are complicated and processing time will be much longer. Therefore, the way for determining the specific value of a divided shot should be suitably selected according to requirement.

Embodiments have been explained referring to specific examples described above. However, the present invention is not limited to these specific examples.

While the apparatus configuration, control method, and the like not directly necessary for explaining the present invention are not described, some or all of them can be selectively used on a case-by-case basis when needed. For example, although description of the configuration of the control unit for controlling the writing apparatus 100 is omitted, it should be understood that some or all of the configuration of the control unit can be selected and used appropriately when necessary.

In addition, any other multi charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
   a writing mechanism configured to include a stage, being movable, for mounting a target object serving as a writing target thereon, and to write a pattern on the target object with multi-beams of a charged particle beam;
   a maximum irradiation time acquisition processing circuitry configured to acquire, for each shot of the multi-beams, a maximum irradiation time of irradiation time of each beam of the multi-beams;
   a unit region writing time calculation processing circuitry configured to calculate, using the maximum irradiation time for the each shot, a unit region writing time by totalizing the maximum irradiation time of the each shot of a plurality of times of shots of the multi-beams which irradiate a unit region concerned while the stage is moved, for each unit region of a plurality of unit regions obtained by dividing a writing region of the target object;
   a stage speed calculation processing circuitry configured to calculate a speed of the stage for the each unit region so that the speed of the stage becomes variable, by using the unit region writing time; and
   a stage control processing circuitry configured to variably control the speed of the stage.

2. The apparatus according to claim 1, wherein a reference position of an irradiatable region which one-time shot of the multi-beams is able to irradiate overlaps with a unit region of the plurality of unit regions, and each shot of the multi-beams belongs as a part to the plurality of times of shots of the multi-beams to irradiate the unit region with which the reference position of a corresponding shot overlaps.

3. The apparatus according to claim 1, wherein the plurality of times of shots are performed by the multi-beams each having a different maximum irradiation time while a position of the each beam is shifted in a state where the irradiatable region is set on the target object.

4. The apparatus according to claim 1, wherein
   the each shot of the multi-beams is divided into a plurality of times of divided shots to continuously irradiate a same position, and
   a number of times of the plurality of times of divided shots is variably set according to the pattern written on the target object.

5. The apparatus according to claim 1, wherein the writing mechanism performs the plurality of times of shots of the multi-beams such that a time period of switching one of the plurality of times of shots to a next one of the plurality of times of shots is variable according to the maximum irradiation time of the each shot of the multi-beams.

6. The apparatus according to claim 5, wherein the writing mechanism eliminates a time exceeding the maximum irradiation time of the each shot in a settable maximum irradiation time settable for one-time shot of the multi-beams so as to perform a next shot of the multi-beams.

7. The apparatus according to claim 1, wherein the each shot of the multi-beams is divided into a plurality of times of divided shots to continuously irradiate a same position, further comprising:
   a divided shot data generation processing circuitry configured to generate, for the each beam of the multi-beams, divided shot data so that a group of divided shots, by which an irradiation time needed for an irradiation position is obtained, is selected from the plurality of times of divided shots.

8. The apparatus according to claim 7, further comprising:
   an eliminating processing circuitry configured to eliminate, for the each shot of the multi-beams, a period of a divided shot which has not been selected by any beam of the multi-beams.

9. A multi charged particle beam writing method comprising:
   acquiring, for each shot of multi-beams of a charged particle beam, a maximum irradiation time of irradiation time of each beam of the multi-beams;
   calculating, using the maximum irradiation time for the each shot, a unit region writing time by totalizing the maximum irradiation time of the each shot of a plurality of times of shots of the multi-beams to irradiate a unit region concerned while moving a stage on which a target object is placed, for each unit region of a plurality of unit regions obtained by dividing a writing region of the target object to be written;
   calculating a speed of the stage for the each unit region by using the unit region writing time so that the speed of the stage becomes variable; and
   writing a pattern on the target object with the multi-beams of the charged particle beam while variably controlling the speed of the stage.

10. A multi charged particle beam writing method comprising:
    writing a pattern on a target object with multi-beams of a charged particle beam while variably controlling a speed of a stage;
    such that the speed of the stage on which the target object is placed is controlled at high speed when writing a region on the target object of high pattern density of the pattern to be written; and
    such that the speed of the stage is controlled at low speed when writing a region on the target object of low pattern density.

* * * * *